United States Patent [19]

Yamane

[11] Patent Number: 4,885,712

[45] Date of Patent: Dec. 5, 1989

[54] METHOD AND APPARATUS FOR PARTIAL TEST-CAUSE GENERATION

[75] Inventor: Yasuaki Yamane, Ebina, Japan

[73] Assignee: Hitachi, Ltd., Tokyo, Japan

[21] Appl. No.: 85,083

[22] Filed: Aug. 13, 1987

[30] Foreign Application Priority Data

Sep. 9, 1986 [JP] Japan .................................. 61-212489

[51] Int. Cl.[4] ........................ G06F 11/00; G06F 11/22
[52] U.S. Cl. .................................... 364/580; 364/550; 371/22.4; 371/25.1
[58] Field of Search ............... 364/550, 578, 200, 900, 364/579, 580; 371/20, 25

[56] References Cited

U.S. PATENT DOCUMENTS 4,342,093  7/1982  Miyoshi ................................ 364/578
4,467,409  8/1984  Potash et al. ....................... 364/200
4,736,338  4/1988  Saxe et al. ........................... 364/578

FOREIGN PATENT DOCUMENTS 59-151248  8/1984  Japan .

Primary Examiner—Felix D. Gruber
Attorney, Agent, or Firm—Fay, Sharpe, Beall, Fagan, Minnich & McKee

[57] ABSTRACT

Disclosed is a test-cause generation method for implementing systematically the function test of logical devices. The method features the generation of partial test-causes for checking the functional relation at each state transition through the operations of entering a boolean function expressed in a decision table indicative of input-output correspondence, checking the constraint conditions for eliminating infeasible combinations between cause nodes, and expanding the decision table to produce all permissible partial test-causes.

4 Claims, 27 Drawing Sheets

| | CAUSE | | TYPES OF CONSTRAINT CONDITIONS | | | | | | | | | | | | | | | | |
|---|---|---|---|---|---|---|---|---|---|---|---|---|---|---|---|---|---|---|---|
| | A | B | 1 | 2 | 3 | 4 | 5 | 6 | 7 | 8 | 9 | 10 | 11 | 12 | 13 | 14 | 15 | 16 |
| COMBI-NATIONAL PATTERNS OF CAUSES | Y | Y | o | o | o | o | x | o | x | o | x | o | x | x | x | x | o | x |
| | Y | N | o | o | o | x | o | o | x | x | o | x | o | x | x | o | x | x |
| | N | Y | o | o | x | o | o | o | x | o | x | o | o | x | x | o | x | x |
| | N | N | o | x | o | o | o | x | o | o | x | x | o | o | x | x | x | x |

CHECK-CAUSE

FIG. 3A
| ITEM | CHECK ITEMS | VENN DIAGRAM | FEATURE |
|---|---|---|---|
| 1 | ○ ○ ○ ○ | 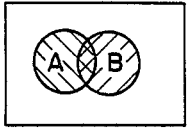 | CHECK ALL COMBINATIONS OF CAUSES |
| 2 | ○ ○ ○ × | 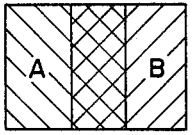 | AT LEAST ONE ITEM IS TRUE (INCLUSIVE CONSTRAINT) |
| 3 | ○ ○ × ○ | 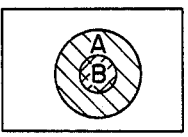 | IF B IS TRUE, THEN A IS TRUE (REQUIRE CONSTRAINT) |
| 4 | ○ × ○ ○ | 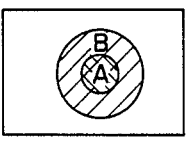 | IF A IS TRUE, THEN B IS TRUE |
| 5 | × ○ ○ ○ | 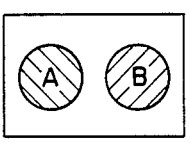 | ONE ITEM AT MOST IS TRUE (EXCLUSIVE CONSTRAINT) |
| 6 | ○ ○ × × | 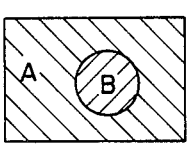 | A IS ALWAYS TRUE |
| 7 | × × ○ ○ | 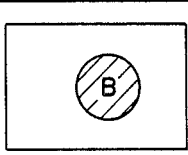 | A IS ALWAYS FALSE |
| 8 | ○ × × ○ | 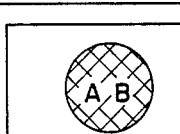 | A AND B ARE EQUIVALENT CAUSES |

FIG. 3B
| ITEM | CHECK ITEMS | VENN DIAGRAM | FEATURE |
|---|---|---|---|
| 9 | x<br>o<br>o<br>x | 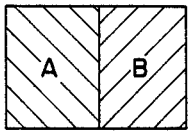 | ONE ITEM IS TRUE |
| 10 | o<br>x<br>o<br>x | 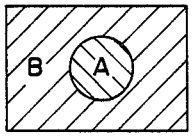 | B IS ALWAYS TRUE |
| 11 | x<br>o<br>x<br>o | 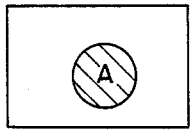 | B IS ALWAYS FALSE |
| 12 | x<br>x<br>x<br>o | 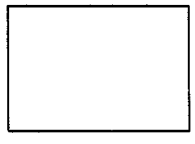 | A AND B ARE ALWAYS FALSE. |
| 13 | x<br>x<br>o<br>x | 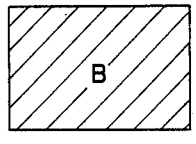 | B IS ALWAYS TRUE, AND A IS ALWAYS FALSE |
| 14 | x<br>o<br>x<br>x | 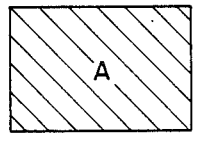 | A IS ALWAYS TRUE, AND B IS ALWAYS FALSE |
| 15 | o<br>x<br>x<br>x | 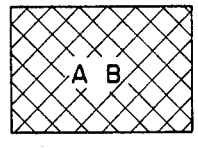 | A AND B ARE ALWAYS TRUE |
| 16 | x<br>x<br>x<br>x | NONE | |

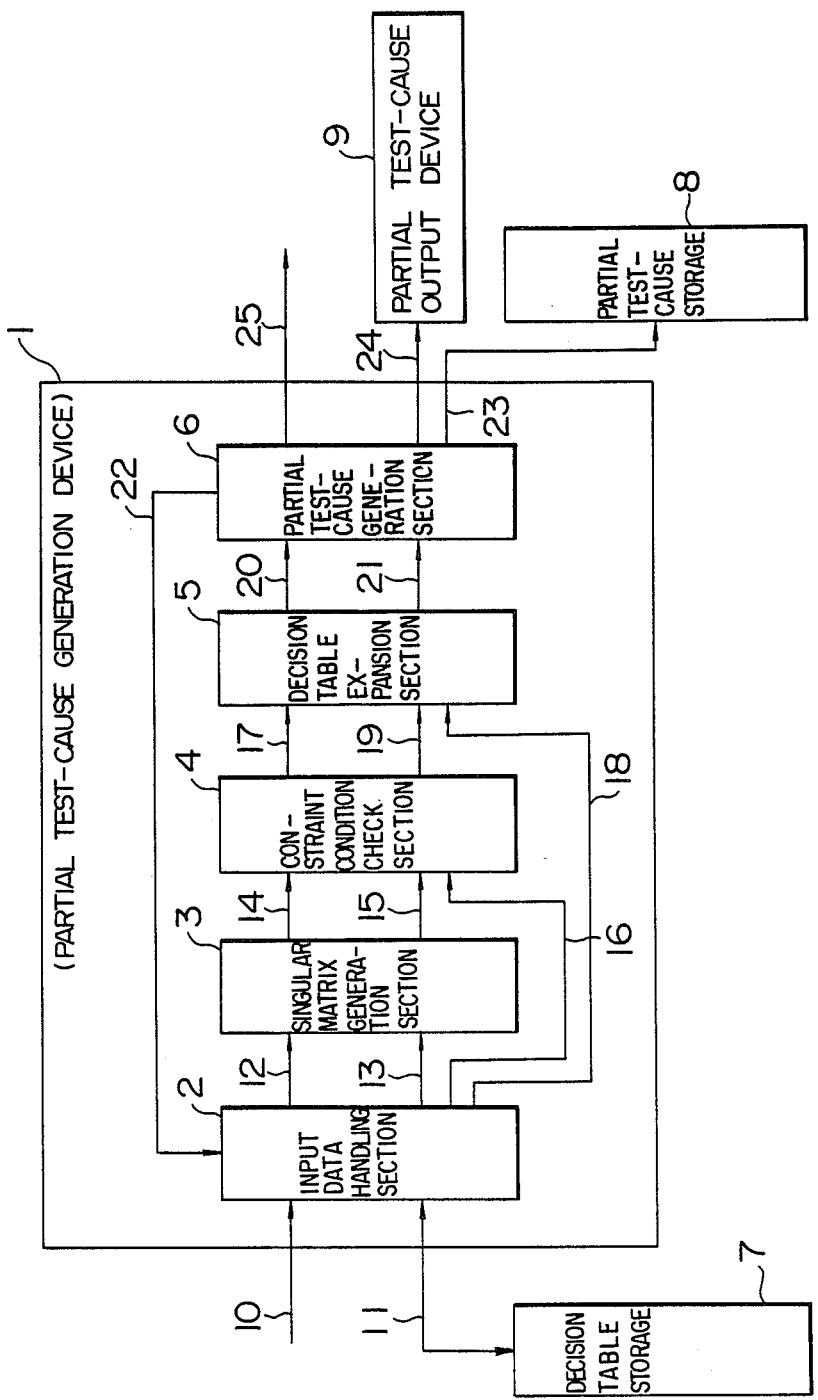

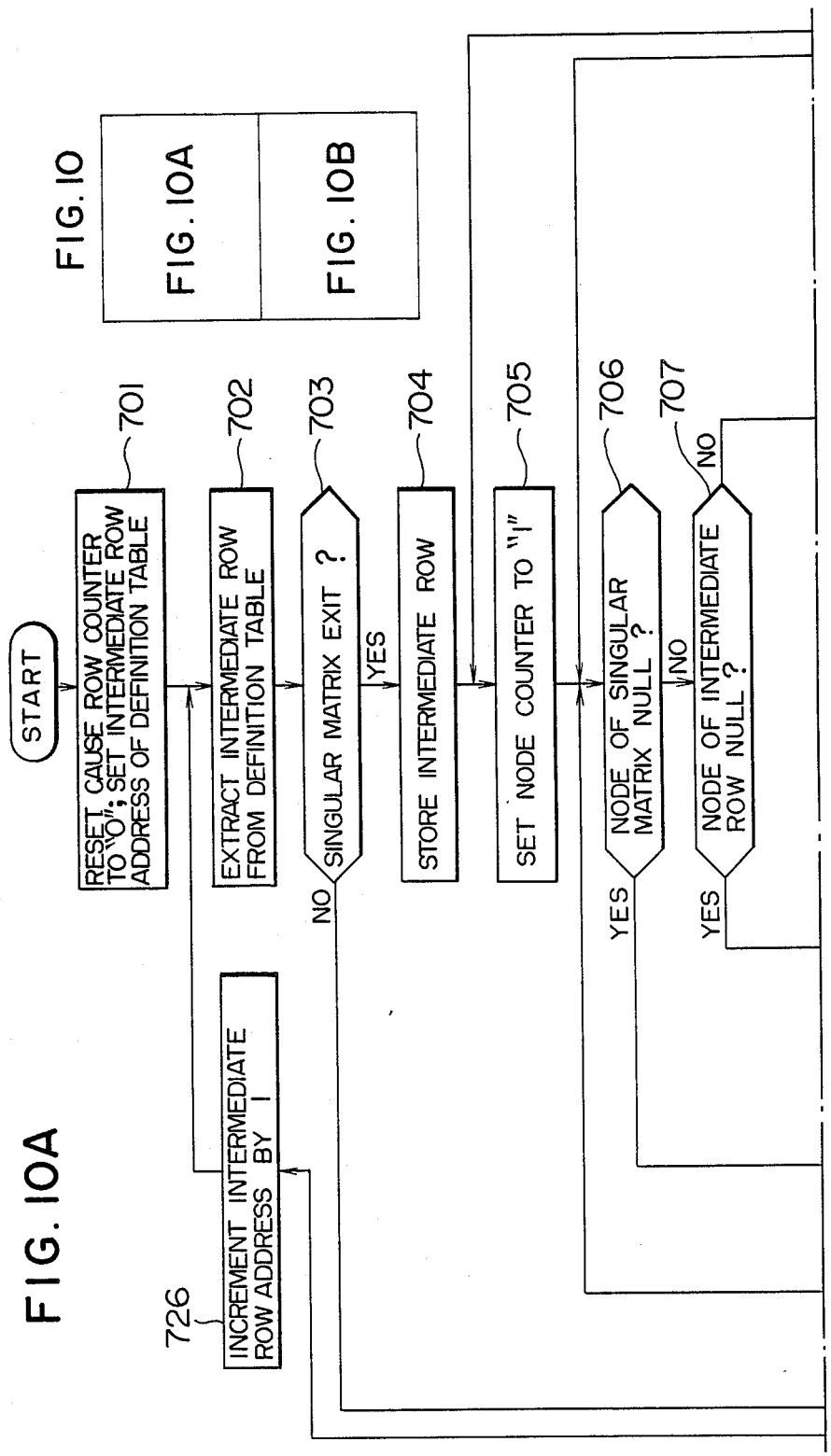

| NUMBER OF CAUSE NODES |
| NUMBER OF INTERMEDIATE NODES |
| NUMBER OF EFFECT ROWS |
| NUMBER OF STATE ROWS |
| NUMBER OF INTERMEDIATE ROWS |
| NUMBER OF CONSTRAINT ROWS |
| NUMBER OF ROWS |
| NUMBER OF COLUMS |

FIG. 19

|  | EFFECT ROWS | | STATE ROWS | | INTERMEDIATE ROWS | | | | | CONSTRAINT ROWS | |
|---|---|---|---|---|---|---|---|---|---|---|---|
| OPERATOR | ∨ | ∨ | ∨ | ∨ | ∧ | ∧ | ∧ | ∧ | ∧ | O | E |
| CAUSE NODES |  |  |  |  | Y | Y |  | N |  |  |  |
|  |  |  |  |  | Y | N | Y | N |  |  |  |
|  |  |  |  |  |  | N | N | N | Y |  | * |
|  |  |  |  |  | N | Y | N | N | Y |  | * |
|  |  |  |  |  |  | Y | N |  | N | * |  |
| INTERMEDIATE NODES | Y |  |  | Y |  |  |  |  |  |  |  |
|  |  | Y |  | N |  |  |  |  |  |  |  |
|  | N |  | Y |  |  |  |  |  |  |  |  |
|  | Y | Y |  |  |  |  |  |  |  |  |  |
|  |  | N |  | N |  |  |  |  |  |  |  |

FIG. 20

| CONSTRAINED CONSTRAINT ROW | CONSTRAINT ROWS — CAUSE NODES <br> 1: _ * _ _ * <br> 2: _ _ * * _ (columns 1 2 3 4 5) |
|---|---|
| CONSTRAINT TYPE | CONSTRAINT ROWS <br> 1: O  2: E |
| CONSTRAINED CAUSE NODE NUMBER | CAUSE NODE NUMBER <br> CONSTRAINT ROWS 1: 2, 5 <br> 2: 3, 4 |
| NUMBER OF CONSTRAINED CAUSE NODES | CONSTRAINT ROWS <br> 1: 2  2: 2 |

FIG. 21

| CONSTRAINT TYPE | CONSTRAINT PATTERN ROW | GENERATED SINGULAR MATRIX | NUMBER OF SINGULAR MATRIX |
|---|---|---|---|
| ONLY-ONE CONSTRAINT | * * | Y N / N Y | $\sum_{K=1}^{n} P_K$ |
| EXCLUSIVE CONSTRAINT | * * | Y N N / N Y N | $\sum_{K=1}^{n} (P_K - 1)$ |
| REQUIRE CONSTRAINT | * * | Y Y N / N Y N | $\sum_{K=1}^{n} (P_K - 1)$ |
| INCLUSIVE CONSTRAINT | * * | Y Y N / Y N Y | $\sum_{K=1}^{n} (2^{P_K} - 1)$ |

FIG. 22

|  | 1ST NODE | | 2ND NODE | |
| --- | --- | --- | --- | --- |
|  | WITHOUT NOT | WITH NOT | WITHOUT NOT | WITH NOT |
| GENERATED PATTERNS | Y<br>N<br>N | N<br>Y<br>Y | Y<br>Y<br>N | N<br>N<br>Y |

FIG. 23

SINGULAR MATRIX OF
ONLY-ONE CONSTRAINT

CAUSE NODES

| 1 | 2 | 3 | 4 | 5 |
| --- | --- | --- | --- | --- |
|  | Y |  |  | N |
|  | N |  |  | Y |

SINGULAL MATRIX OF
EXCLUSIVE CONSTRAINT

CAUSE NODES

| 1 | 2 | 3 | 4 | 5 |
| --- | --- | --- | --- | --- |
|  |  | Y | N |  |
|  |  | N | Y |  |
|  |  | N | N |  |

METHOD AND APPARATUS FOR PARTIAL TEST-CAUSE GENERATION

BACKGROUND OF THE INVENTION

1. Field of the Invention

This invention relates to a method and apparatus for the test-cause generation which, for example, systematically performs the function test for a logical device, and particularly to a method and apparatus for the test-cause generation capable of reducing the processing time without sacrificing the test accuracy in partial test-cause generation, which conventionally has consumed a lot of time when there are intricate boolean functions between inputs and outputs.

2. Description of the Prior Art

The conventional test-cause generation method, which generates test-causes for use in testing a logical device whose functions are expressed by state transitions and combinatorial logics, such as a computer, and thus in testing a computer program, is designed to transform the boolean functions expressed in decision tables into cause-effect graphs having the equivalent logical meaning and generate partial test-causes in one state based on the boolean functions expressed in the cause-effect graphs, as disclosed for example in Japanese Patent Unexamined Publication No. 59-151248. In this case, the final test-cause is produced by combining partial test-causes generated for each state.

However, the above-mentioned conventional technique has expended an extremely long time in generating partial test causes when the input-output correspondence has intricate boolean functions, and the test-cause generation process must have been aborted in some case, due to the following reason.

(1) The cause-effect graph is used for expressing a boolean function, necessitating the constraint conditions for eliminating infeasible combinations, and this check process needs time.

(2) The test pattern generation algorithm oriented to hardware circuits is used for partial test-cause generation, and it takes a large number of trials in generating a consistent test pattern when a combination out of the constraint conditions is removed.

SUMMARY OF THE INVENTION

It is an object of this invention to overcome the foregoing prior art deficiency and to provide a method and apparatus for test-cause generation which accomplishes the speed-up of process without sacrificing the test accuracy.

In order to achieve the above objective, the present invention features a partial test-cause generation process in which a boolean function indicating the input-output correspondence in the form of a decision table is entered, a check for the constraint conditions is conducted for eliminating infeasible combinations between cause nodes, and partial test-causes for checking the relation at each state transition are generated by expanding the decision table so that all permissible partial test-causes are generated.

According to the inventive partial test-cause generation method, the decision table is expanded into combinations in which all unrelated conditions are true and combinations in which they are false, for the boolean functions consistent with the constraint conditions defined in the input decision table, and partial test-causes are generated by removing already generated combinations if they exist. This process scheme facilitates the test pattern generation which is conformable to discrepancy checking, and the speed-up of process is accomplished.

BRIEF DESCRIPTION OF THE DRAWINGS

FIGS. 3A, 3B are tables showing examples of Venn diagram which express constraint conditions;

FIG. 4 is a block diagram showing the partial test-cause generation device embodying the present invention;

FIGS. 10A and 10B taken together as in FIG. 10 are a flowchart showing the operation of the constraint condition check section;

FIG. 19 is a diagram showing input data stored in the definition table;

FIG. 20 is a table showing examples of information related to the constraint conditions;

FIG. 21 is a table showing the method of singular matrix generation for each type of constraint;

FIG. 22 is a table showing the alteration of handling at the occurrence of a required constraint;

FIG. 23 is a set of diagrams showing the generation of singular matrices;

DESCRIPTION OF THE PREFERRED EMBODIMENT

An embodiment of this invention will now be described in detail with reference to the drawings.

The inventive partial test-cause generation method consists of five processing steps. These are input data editing, singular matrix generation, constraint condition checking, pattern row generation by the decision table method, and partial test-cause generation. The following describes the details of each processing step.

(1) Input data editing

Figure 16:
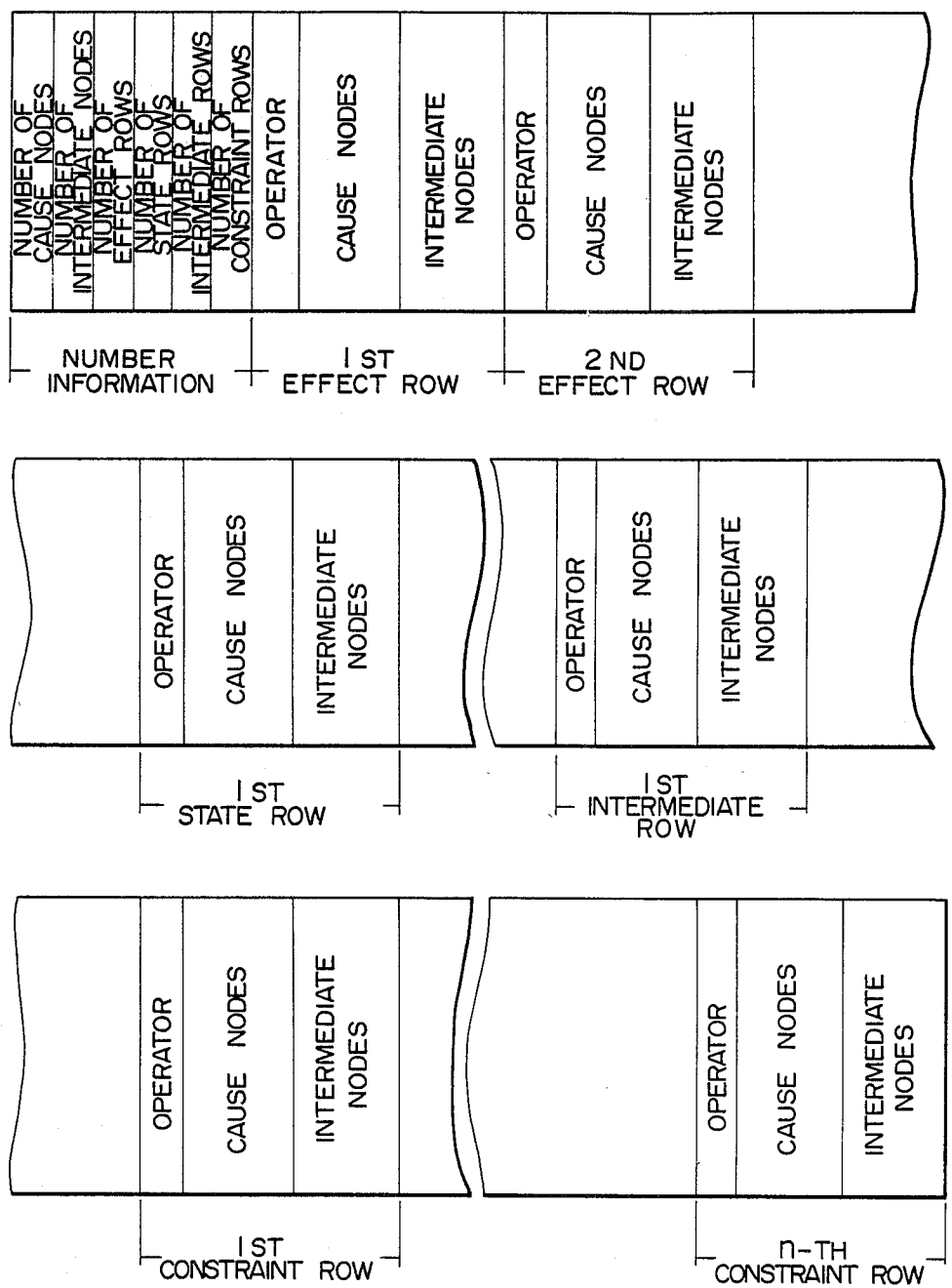
FIG. 16 is a diagram showing the format of the input file data.

Boolean functions indicating the input-output correspondence in the form of decision tables are provided for entry to the system as a file of sequential list of data in the external storage unit. The data structure includes the number information at the top, which is followed by a cluster of row information each made up of an operator, cause nodes and intermediate nodes, and the information is filed in the order of effect rows, state rows, intermediate rows and constraint rows, as shown in FIG. 16. The decision tables list the output conditions and the states after transition for all combinations of input conditions, and this expression method is useful for avoiding missing and overlapping combinations.

The following gives a brief explanation for the terms which appear throughout this specification.

The decision table is a method for describing actions corresponding to input conditions, and this decision table lists the presence or absence of actions in combination with all input conditions, as shown in the following Table 1. The operator is to indicate the relation between causes, relation between effects and relation between states. The relation between causes is AND, since their relation must be agreed in order to provide an effect, and the relation between effects or states is OR, since more than one effect or state is produced by combinations of causes. The cause node indicates an individual cause (input condition), and the intermediate node is a state resulting from a combination of cause nodes with its number being dependent on the number of combinations of cause nodes.

TABLE 1

| Intermediate nodes | | I1 | I2 | I3 | I4 |
|---|---|---|---|---|---|
| Cause nodes | C1 | Y | Y | N | N |
| | C2 | Y | N | Y | N |
| Effect nodes | E1 | Y | Y | Y | N |

The effect row is a list of information including operators and intermediate nodes (indicative of the state of result) of effect nodes by the number of effect nodes, and the cause node information is to set spaces by the number of cause nodes. The state row is a list of information including operators and state in the result of transition from a cause and effect by the number of states, and the cause node information is to set spaces by the number of cause nodes. The intermediate row is a list of information including operators and conditions arising by the combination of cause nodes, by number of combination, and the intermediate information is to set spaces by the number of intermediate nodes. The constraint row is the definition of the relation between cause nodes which cannot be expressed by boolean function, e.g., only one of two causes is true, or one state of cause is influenced by other, and it is used to remove infeasible combinations.

The state is the result of transition at which input-wait occurs. The following explains state transition by taking an example of FIG. 1 for an automatic cash dispenser. State S0 is the initial state, in which the system is waiting for the entry of a card. When a card is entered, a message "ENTER SECRET CODE" is displayed in state S1. Following the entry of a code, the system collates it with the registration file, and upon validity detection the system displays a message "ENTER AMOUNT" in state S2. If the entered code is not valid, the system counts the number of occurrence of invalidity and by detecting the third entry of unacceptable code it displays a message "PROCESS ABORTED" in state S3 and cancels the registration for that card. Then, the system returns to state S0 with a message "ENTER CARD" being displayed. When the system counts the first or second entry of unacceptable code in state S1, it displays a message "ENTER SECRET CODE AGAIN", and waits for the reentry. In state S2, if the entered amount is found to exceed the balance, the system displays a message "ENTER AMOUNT AGAIN", and waits for the re-entry. If the entered amount does not exceed the balance, the system displays the specified amount and a new balance in state S3, and returns to state S0. These operations are expressed by a decision table as shown in Table 2.

TABLE 2

| E[ | Cause | Valid code input | Y | N | N |
|---|---|---|---|---|---|
| | | Third false code input | N | Y | N |
| | Effect | Amount input | * | | |
| | | Secret code re-input | | | * |
| | | Process abortion | | * | |
| | | Registration cancellation | | * | |
| | Transition result | State S1 | | | * |
| | | S2 | * | | |
| | | S3 | | * | |

In this example, more than one input condition is not agreed simultaneously, and therefore an exclusive constraint condition (expressed by E) is appended to the input condition. In Table 1, symbol Y denotes a true condition, N denotes a false condition, and * denotes a true condition.

Figures 17, 18:
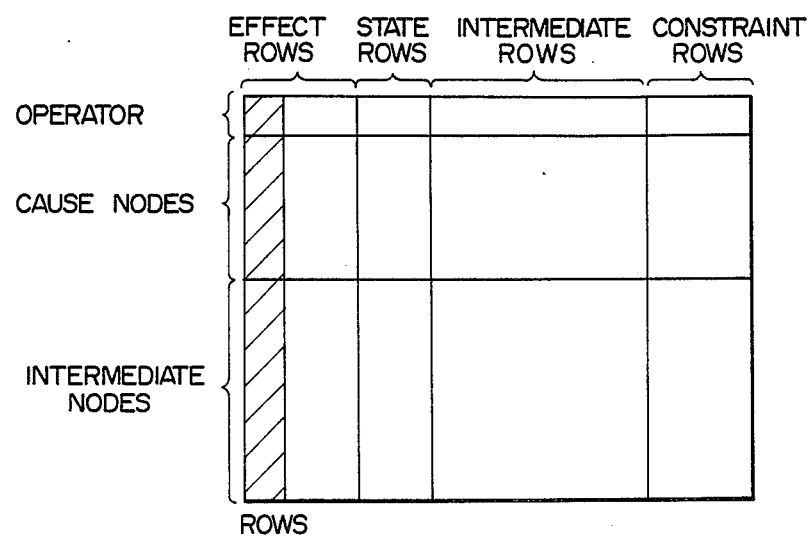
FIG. 17 is a diagram showing the structure of the definition table.
FIG. 18 is a diagram showing the structure of the number information table.

In order to generate partial test-causes from the decision table, according to the inventive method, the data structure of boolean functions is transformed into a definition table as shown in FIG. 17 and it is stored in units of row in compliance with the data structure of boolean functions.

For information about the definition table, a number information table shown in FIG. 18 is produced so that it is referenced. The value which each node can take, as expressed in the definition table, is any of true (Y), false (N) and disregard ( ). The operator including the functional relation always takes OR for an effect row and state row, while it always takes AND for an intermediate row.

For a constraint-row, the operator as a constraint condition is given a setting of constraint from among Only-one, Exclusive, Require, Inclusive, and without constraint condition, each of which will be explained later.

The constraint condition is the definition of relation between cause nodes that cannot be expressed by boolean function, e.g., only one of two causes is true, or one cause is influenced by other, and this information is used to remove infeasible combinations.

The following describes the constraint condition by taking an example. The number of test-causes (relation between causes and effects) generally increases drastically with the increase in the number of causes. In order to suppress the increase, relation between causes are classified. The relation between causes is called "constraint condition", and it is used to eliminate infeasible combinations between causes in each type.

Supposing two causes A and B, they have four combinations as shown in Table 3.

TABLE 3

| Causes | Cause combination Pattern | | | | |
|---|---|---|---|---|---|
| | Combinations of causes | | | | |
| A | Y | Y | N | N | Y: True cause, |
| B | Y | N | Y | N | N: False cause |

Figures 1, 2:
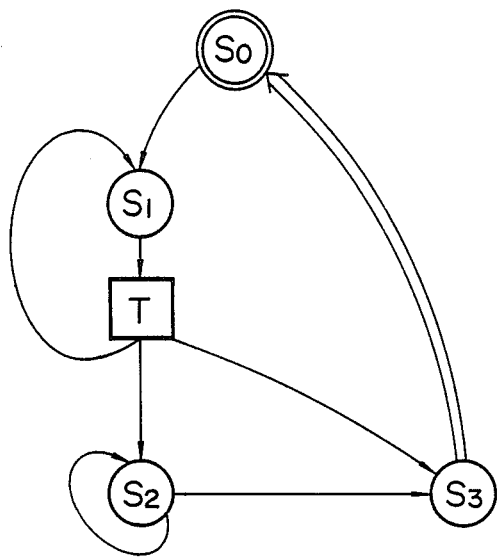
FIG. 1 is a diagram showing an example of state transitions.
FIG. 2 is a table showing an example of constraint conditions.

Some combinations of causes are permissible, while other are not, and the combination pattern under this constraint has 16 ($2^4$) cases. FIG. 2 shows the types of constraint condition, in which symbol "o" stands for a permissible combination, and symbol "X" stands for an impermissible combination. This constraint combination pattern is expressed in Venn diagram as shown in FIGS. 3A and 3B. In the figures, the combinations with item numbers 6, 7, 8, 10, 11, 12, 13, 14 and 15 are the cases in which one of causes A and B is always true or false, and therefore these combinations need not be considered and can be removed from the constraint conditions. The combination with item number 16 does not exist in reality and also can be removed. In addition, the combination with item number 4 can be treated identically to that with number 3 by replacing the position of causes, and it can be removed. As a result, the remaining types of constraints are those with item numbers 1, 2, 3, 5 and 9. In the case of combination with item number 1, there is no useful information available from the relation of inclusion or congruence between the defined areas of causes A and B, and therefore all combinations of conditions need to be checked. When this constraint condition is defined to be a base constraint condition, there remain four types of constraint conditions as given below. Each constraint condition, by its characteristics, can eliminate some check items as follows.

For Inclusive constraint with item number 2, check items with both of causes A and B being false may be removed.

For Require constraint with item number 3, check items with cause B being true and cause A being false may be removed.

For Exclusive constraint with item number 5, check items with both of causes A and B being true may be removed.

For Only-one constraint with item number 9, check items with both of causes A and B being either true or false may be removed.

As described above, impermissible combinations between causes can be removed efficiently depending on the constraint condition.

FIG. 19 shows an example of input data stored in the definition table. In the figure, symbol ∪ denotes OR, ∩ denotes AND, Y denotes true, N denotes false, * denotes constraint, 0 denotes Only-one constraint, and E denotes Exclusive constraint. The following explains the process of generating partial test-causes by using this example.

(2) Singular matrix generation

The singular matrix is to express the state of effect nodes which are determined upon determination of the state of cause nodes, and the purpose of generating the singular matrix is to eliminate infeasible combinations. In order to generate a singular matrix, constrained constraint rows, types of constraints, constrained cause node numbers, and the numbers of constrained cause nodes for each constraint row are extracted from the definition table.

FIG. 20 shows the constrained constraint rows, the types of constraints, the constrained cause node numbers, and the numbers of constrained cause nodes for each constraint row extracted from the example of FIG. 19.

The constrained constraint row is a list of combinations of constrained cause nodes, and this data is used for the internal process. The type of constraint is to indicate the type of constraint for each constraint row, and this data is used for the internal process. Constraints include Only-one, Exclusive, Require, and Inclusive constraints. The constrained cause node number is a number appended to a constrained cause node, and this data is used for the internal process. The number of constrained cause nodes is the number of constrained cause nodes for each constraint row, and this data is used for the internal process.

Subsequently, for the constrained constraint row, a pattern with a setting of condition value (true or false) in compliance with the constraint type is produced. This pattern, which is a combination of values, is a singular matrix. Accordingly, non-constrained cause nodes are left null (disregard).

FIG. 21 shows the method of producing singular matrices of each constraint type. In the figure, K takes values from 1 to n, representing constraint rows, and $P_K$ represents the number of constrained cause nodes for the kth constraint row. The only-one constraint is that one (not more than one) constraint condition is always true, and the singular matrix is produced in the order from row to column by setting for constrained cause nodes "true" on the diagonal downward from the first cause node and "false" for other cause nodes. Accordingly, the number of singular matrices generated is equal to the number of constrained cause nodes. When the cause node and constraint row are both unity, only one singular matrix exists, and it is given "true" as a condition value.

Exclusive constraint is a constraint in which only one at most or no constraint condition is true. The procedure of singular matrix generation in this case is the same as Only-one constraint, provided that for the case of absent true condition, the singular matrix generation identical to Only-one constraint is added by a singular matrix pattern without any true condition (the information created by combining condition values with constrained cause nodes based on the constraint type). Therefore, the number of singular matrices generated is equal to the number of constrained cause nodes plus one.

In the case of Require constraint, the number of cause nodes is always two, and they are defined as A Require B. A and B are called "first node" and "second node", respectively, and the constraint is set to both nodes. The singular matrix has three cases: both nodes are true, the first node is true and second node is false, and both nodes are false, and the combination of these cases is always produced. This constraint has a rule of sequence, and constraints are defined in some cases to distinguish the first and second nodes and the presence or absence of negation (NOT). In such cases, handling of Require constraint is altered and a generated pattern in compliance with FIG. 22 is made to be a singular matrix pattern.

Inclusive constraint is the case where at least one (some times more than one) constraint condition is true. Constraint conditions are set by repeating condition values (true and false) $2^{n+1}$ times each (where n is the constrained cause number in constraint rows, and it is numbered 1, 2, 3, and so on). Accordingly, the number of singular matrices is 2 powered by the number of constrained cause nodes minus one. FIG. 23 shows the singular matrix produced from the example of FIG. 20.

(3) Constraint condition check

Figure 24:
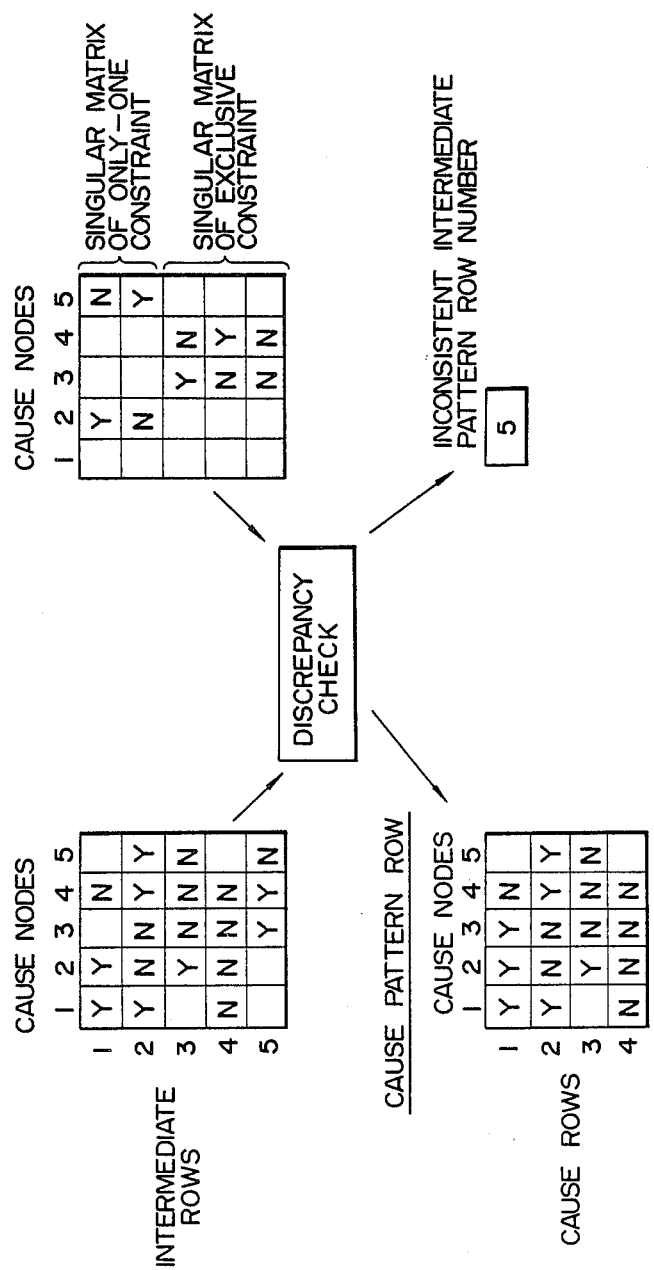
FIG. 24 is a diagram showing the generation of a cause pattern row from an intermediate pattern row and a singular matrix.

Elimination of infeasible combinations between cause nodes is carried out by comparing individual patterns of intermediate rows extracted from the definition table with patterns of all singular matrices. Comparison with the singular matrix patterns takes place in units of singular matrix set of each constraint type, and although it is enough to agree with the pattern of one singular matrix in one set of constraint, this must be fulfilled for sets of all constraint types. During the process, if the node value of singular matrix is not null, but the node value of intermediate row is null, comparison is done by setting the node value of singular matrix to the null node of intermediate row. For each set of constraint type, intermediate rows which agree with at least one singular matrix are preserved as cause patterns, and intermediate row which do not agree with any singular matrix are removed. This process is executed repeatedly for all intermediate rows, and a cause pattern row (list of patterns produced through the removal of infeasible combinations between cause nodes ) is produced. FIG. 24 shows the cause pattern row produced from the intermediate row and singular matrix through the discrepancy check.

(4) Pattern row generation by decision table expansion method

For each pattern of cause pattern row, a condition value (true or false) is set to nodes having no setting of cause, for all permissible combinations. Consequently, the number of cause pattern rows is expanded to $2^n$ (where n is the number of nodes having no setting of cause). Setting of condition value is done by setting true or false repeatedly by $2^{n-1}$ times (where n is the sequence number of null node occurrence) in accordance with the sequence of occurrence of null nodes. Effect rows and state rows are extracted from the definition table, so that they are expanded to pattern rows corresponding to the cause pattern rows. At this time, the condition value of false is set for all null nodes.

Subsequently, the cause patterns are checked in the order of generation, and if overlapping cause patterns exist, cause patterns which have been examined later and effect patterns and state patterns corresponding to these cause patterns are removed. Intermediate pattern rows are produced in correspondence to non-overlapping cause pattern rows. The number of nodes of pattern is dependent on the number of intermediate nodes in the definition table, and the value of true is set to nodes corresponding to the row numbers of intermediate patterns and the value of false is set to other nodes.

Figure 25:
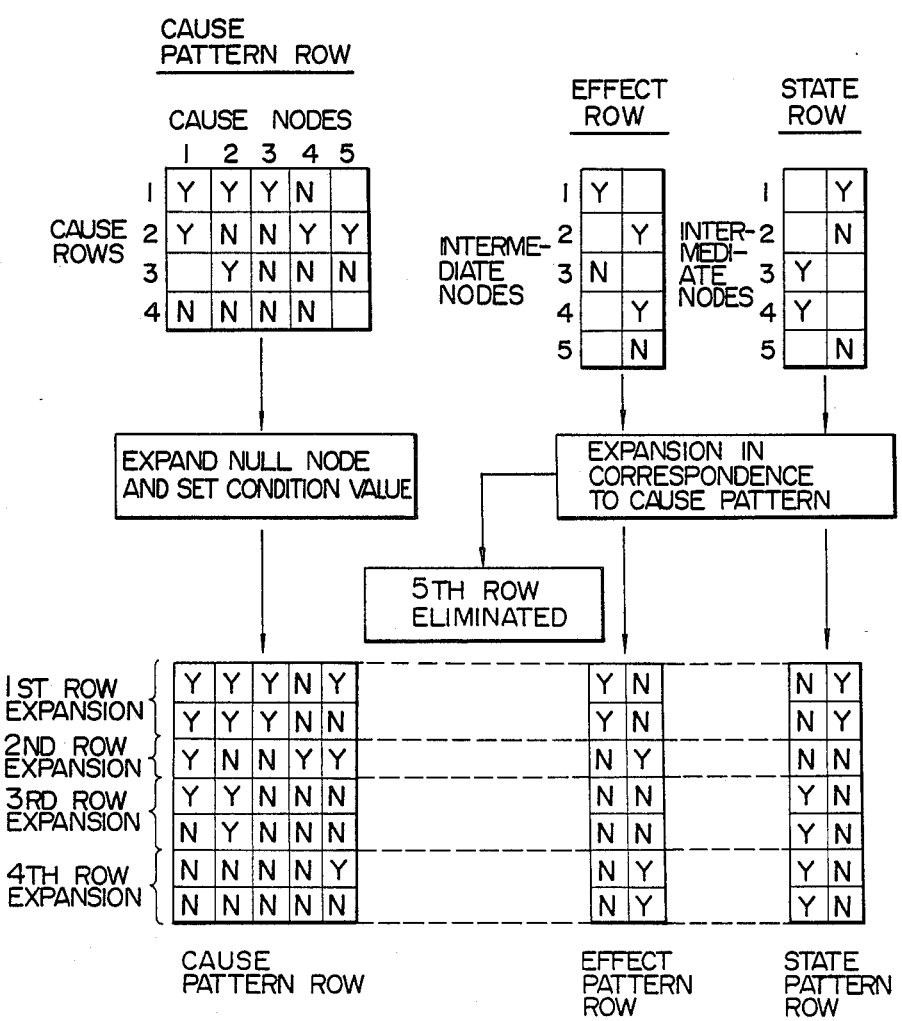
FIG. 25 is a diagram showing the generation of a cause, effect and state patterns.
Figure 26:
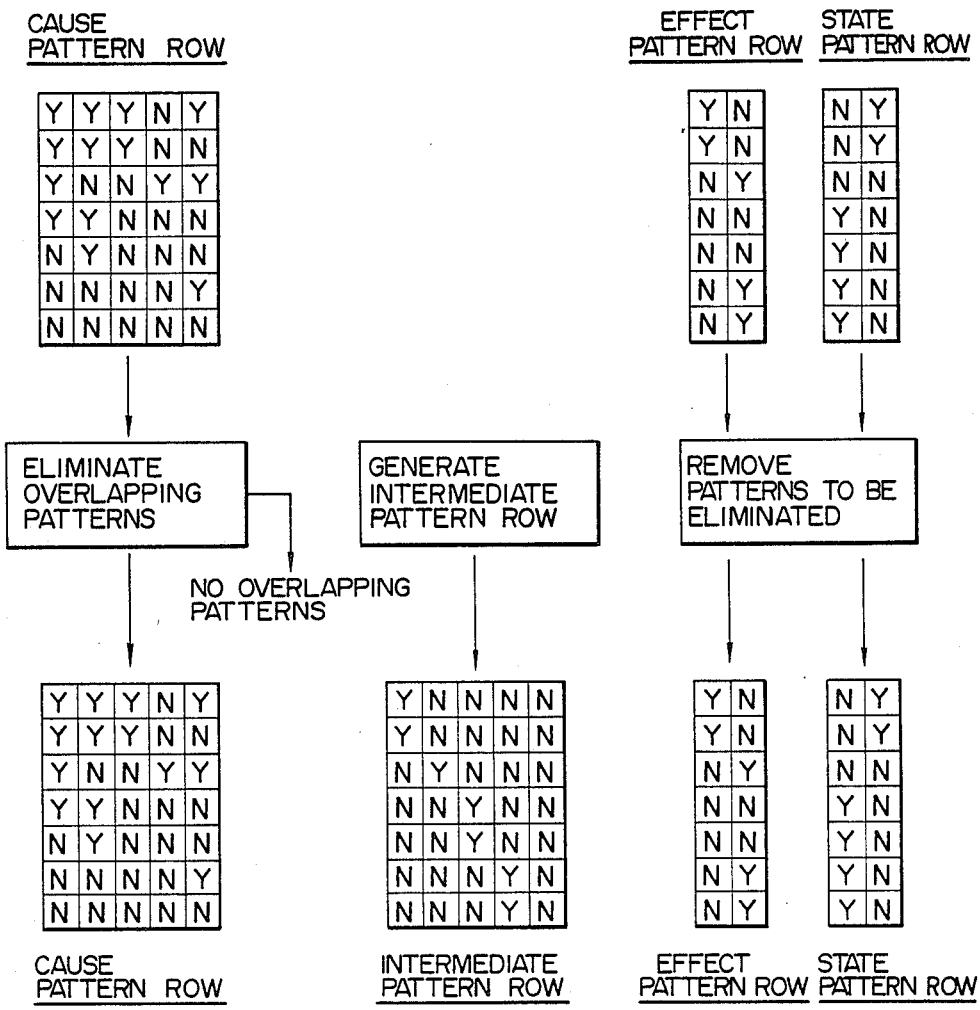
FIG. 26 is a diagram showing the deletion of a duplicated pattern.

FIG. 25 shows cause pattern rows expanded in accordance with the number of null nodes, and effect and state pattern rows expanded in correspondence to the cause pattern rows. FIG. 26 shows cause, effect and state pattern rows after removal of overlapping patterns and intermediate pattern rows produced in correspondence to the cause pattern rows.

(5) Partial test-cause generation

For cause, effect and state pattern rows, the validity check is conducted in units of node row of each pattern which constitutes the pattern rows. Intermediate pattern rows are not checked.

The effect pattern row is a list of patterns produced by removing unnecessary patterns in correspondence to the cause pattern row. The state pattern row is a list of patterns produced by removing unnecessary patterns in correspondence to the cause pattern row. The intermediate pattern row is a list of patterns corresponding to the cause pattern row and it is to retain the sequence of process for intermediate nodes.

In this checking, if at least one condition value is true or false, the node row is determined to be true, or if all condition values are true or false, the node row is determined to be false. For false node rows, a pertinent message is issued.

Figure 27:
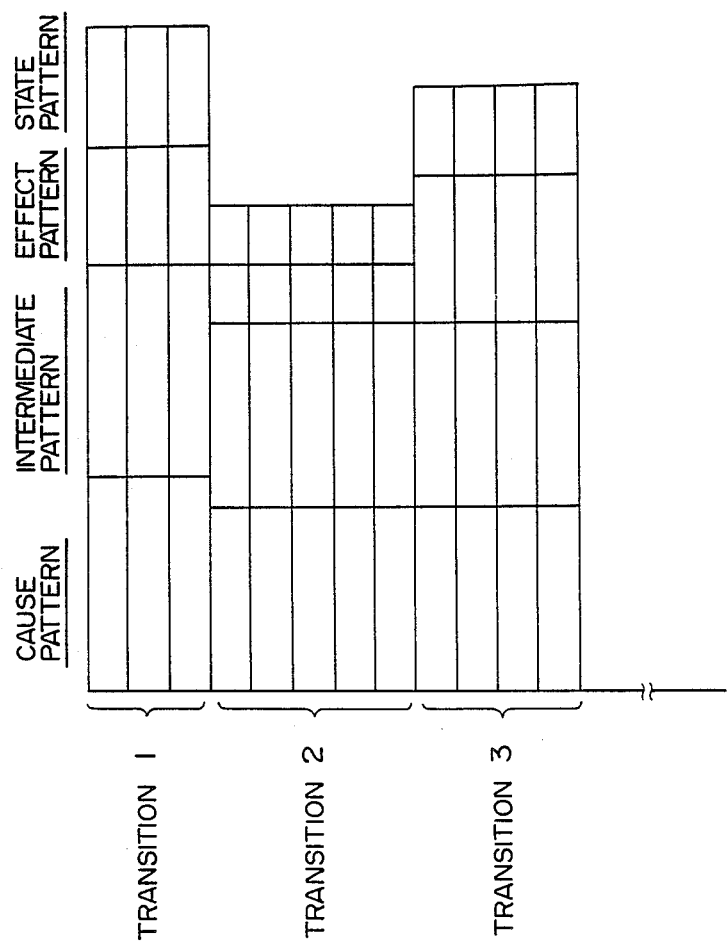
FIG. 27 is a diagram showing the storage structure for partial test-causes.

Next, check is conducted for the state pattern rows. The state pattern has only one node to which a true condition is set, and its remaining nodes are false. If this condition is not met, a pertinent message is issued. Finally, partial test-cause are produced. These are patterns edited from cause, intermediate, effect and state patterns. The partial test-causes are produced in units of transition, and they are stored in the internal storage area. FIG. 27 shows the structure of partial test-causes in the storage.

In the partial test-cause generation method, the foregoing processing steps (1) through (5) are repeated at each occurrence of transition so as to produce a partial test-cause for each transition, and the process completes when the specified number of transition is reached.

Next, an embodiment of the automatic processing system which realizes the inventive partial test-cause generation method will be described.

FIG. 4 shows the arrangement of the partial test-cause generation device based on the inventive partial test-cause generation method. The partial test-cause generation device 1 receives boolean functions between inputs and outputs expressed in decision tables, produces all partial test-causes permitted by the decision table expansion method, and stores the output.

As shown in the figure, the partial test-cause generation device 1 of this embodiment consists of an input data handling section 2, a singular matrix generation section 3, a constraint condition check section 4, a decision table expansion section 5, and a partial test-cause generation section 6. The system has external devices including a decision table storage 7, a partial test-cause storage 8 and a partial test-cause output device 9.

Figure 5:
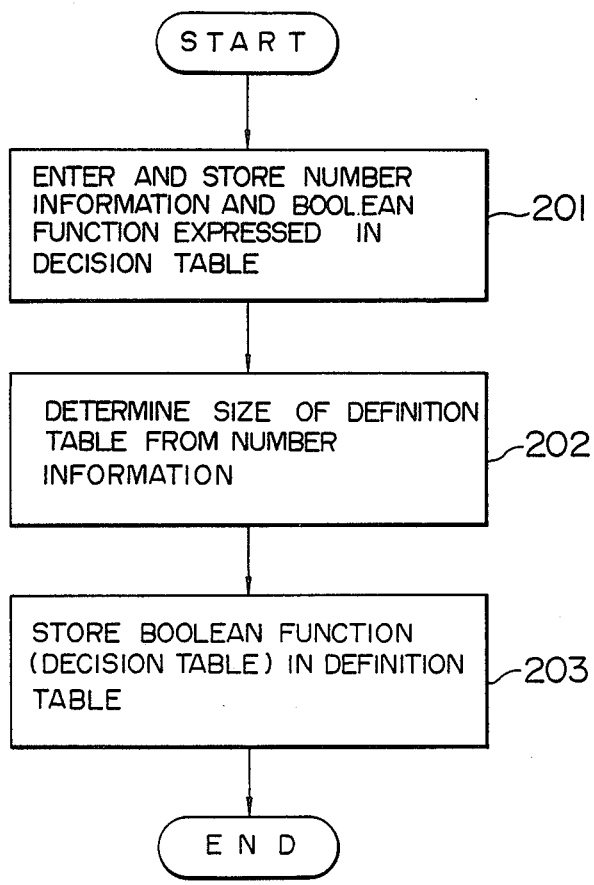
FIG. 5 is a flowchart showing the operation of the input data handling section.

The operation of the partial test-cause generation device 1 will be described in the following. The partial test-cause generation device 1 commences the process upon receiving a start signal 10 at its input data handling section 2. FIG. 5 shows in flowchart the operation of the input data handling section 2. Following the reception of the start signal 10 or transition signal 22, the input data handling section 2 takes in the number information and boolean function data 11 expressed in a decision table from the decision table storage 7 (step 201). The section 2 produces the number information table shown in FIG. 18, determines the size of the definition table in accordance with the information (step 202), and stores the boolean function in the definition table (step 203). After that, the section 2 transmits an end signal 12 to the singular matrix generation section 3 which implements the subsequent steps.

Figure 6:
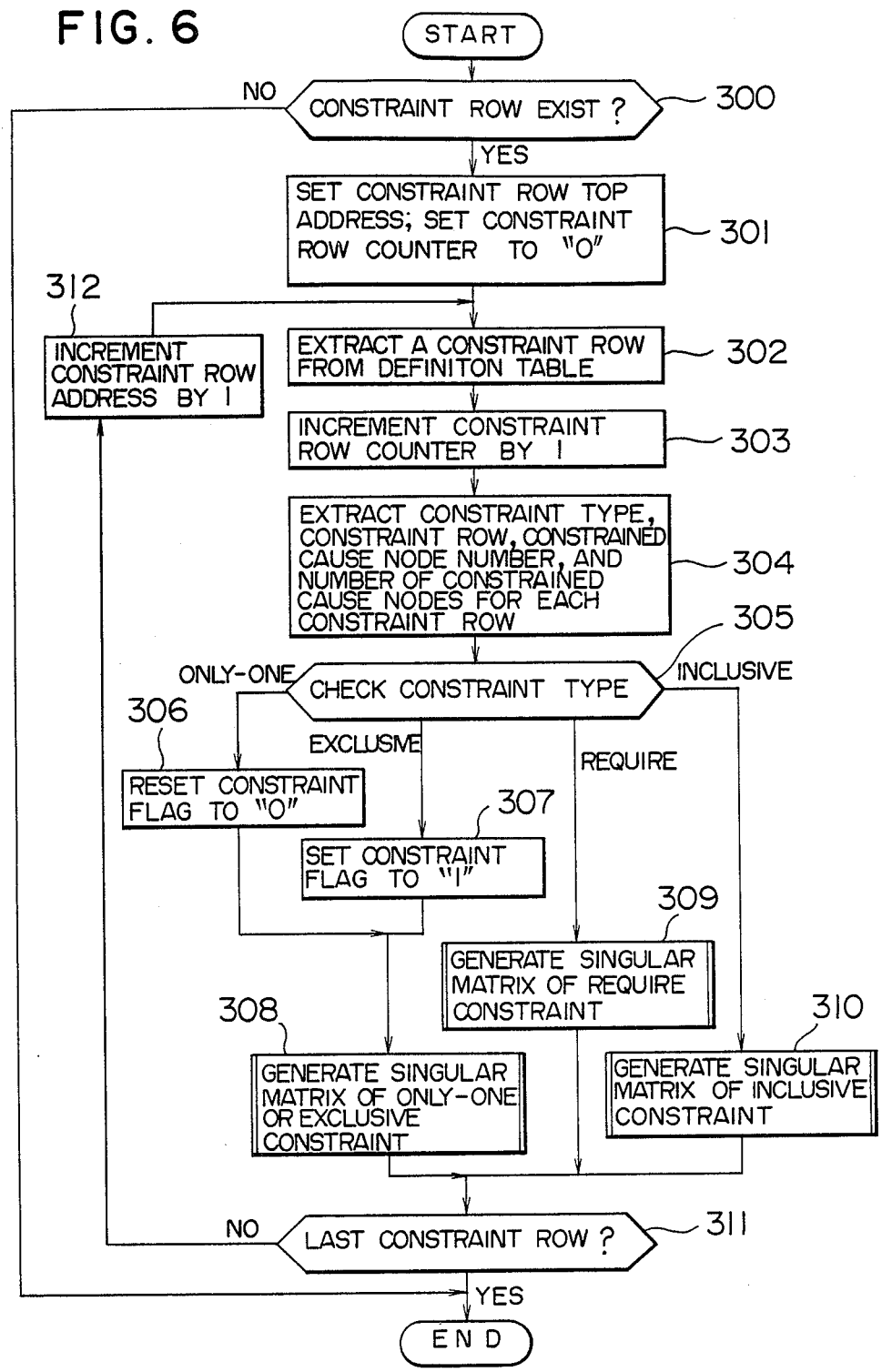
FIG. 6 is a flowchart showing the operation of the singular matrix generation section.

The singular matrix generation section 3 is to produce, from constraint rows, a singular matrix for eliminating infeasible combinations. FIG. 6 shows in flowchart the operation of the singular matrix generation section 3. Upon receiving the end signal 12 from the input data handling section 2, the singular matrix generation section 3 checks the presence or absence of constraint rows (step 300). If no constraint row exists, singular matrix generation does not take place. When constraint rows exist, the section 3 sets the constraint row starting address and resets the constraint row counter to "0" (step 301). Subsequently, the section 3 extracts one of constraint rows 13 from the definition table in accordance with the constraint row address (step 302), increments the constrainted row counter by one (step 303), and extracts the constraint type, constraint row, constraint cause node number and the number of constrained cause nodes for each constraint (step 304).

The singular matrix generating process is classified in accordance with the extracted constraint type, and the section 3 produces a singular matrix based on the constraint type (step 305-310). The section 3 checks the constraint row (step 311) and, if it is found present, the section 3 increments the constraint row address by one (step 312), and receives another constraint row from the definition table for carrying out the process repeatedly. After all constraint rows stored in the definition table have been entered or if no constraint row exists, the section 3 transmits an end signal 14 to the constraint condition check section 4 which implements the following steps.

Figure 7:
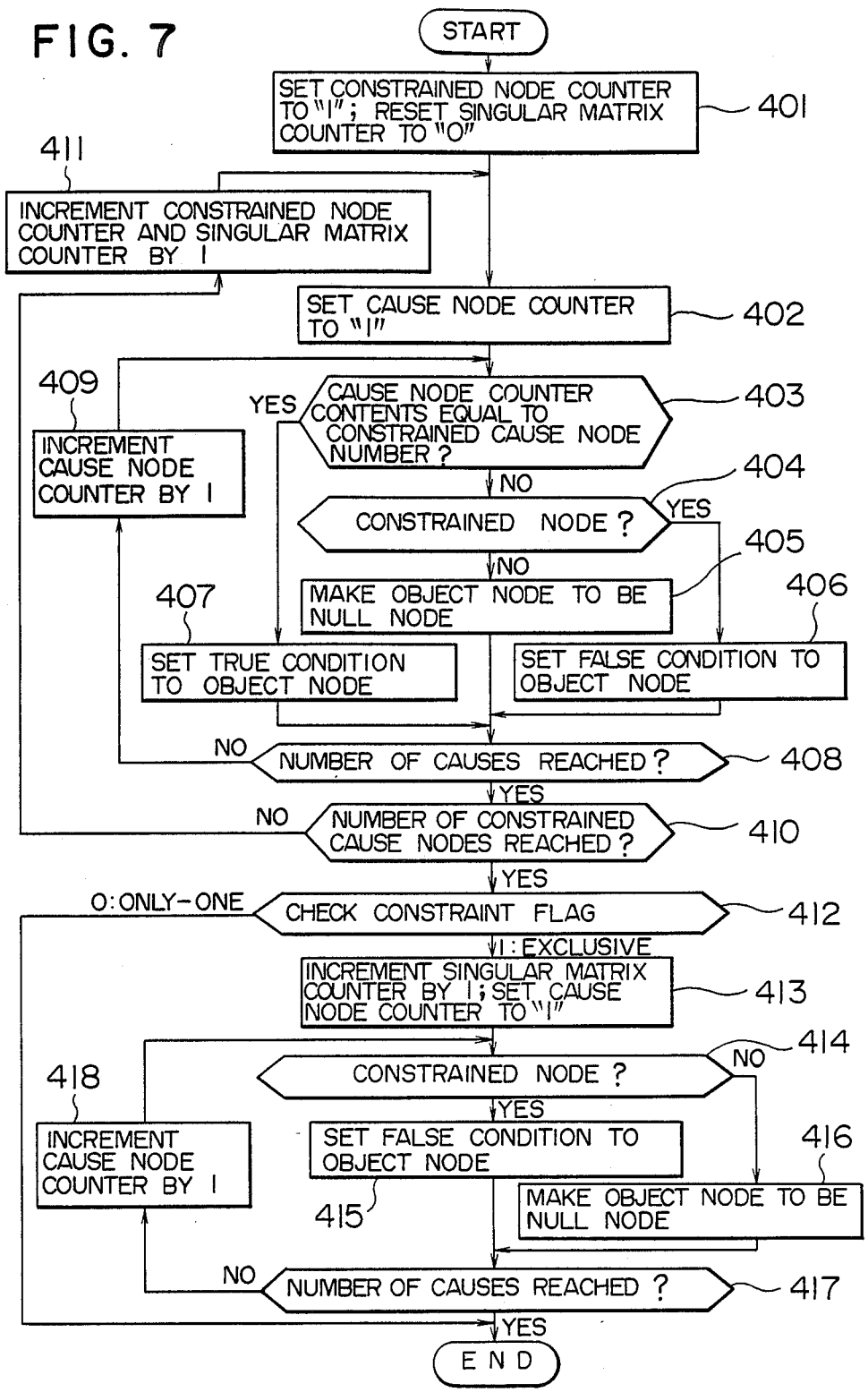
FIGS. 7, 8 and 9 are flowcharts of the subroutines included in FIG. 6.

FIG. 7 shows in flowchart the operation of generating singular matrices classified as Only-one or Exclusive constraints. In response to the initiation request based on the constraint type, the section 4 sets the number of constrained nodes counter to "1" and resets the singular matrix counter to "0" (step 401). The section 4 further sets the cause node counter to "1" (step 402), and compares it with the constrained cause node number (step 403). If the comparison agrees, the section 4 sets a true condition for the object node of singular matrix (step 407). If the comparison disagrees, the section 4 checks whether or not the node is a constrained node (step 404). In case of a constrained node, the section 4 sets a false condition for the object node of singular matrix (step 406), or if it is not a constrained node, the object node of singular matrix is made to be a null node (step 405).

The section 4 checks the number of causes (step 408), increments the cause node counter by one until execution for all causes completes, and repeats the above process (steps 403-408), thereby producing a singular matrix. After the process for all causes has completed, the section 4 checks the number of constrained cause nodes (step 410), increments the constrained node counter and singular matrix counter by one (step 411), and repeats the singular matrix generation process (steps 402-410). Subsequently, the section 4 checks the constraint flag (step 412) and, if it indicates Exclusive constraint, the section 4 produces a singular matrix with a false condition being set to constrained nodes and a null for other nodes (steps 413-418). In case of Only-one constraint, the section 4 does nothing and terminates the process.

Figure 8:
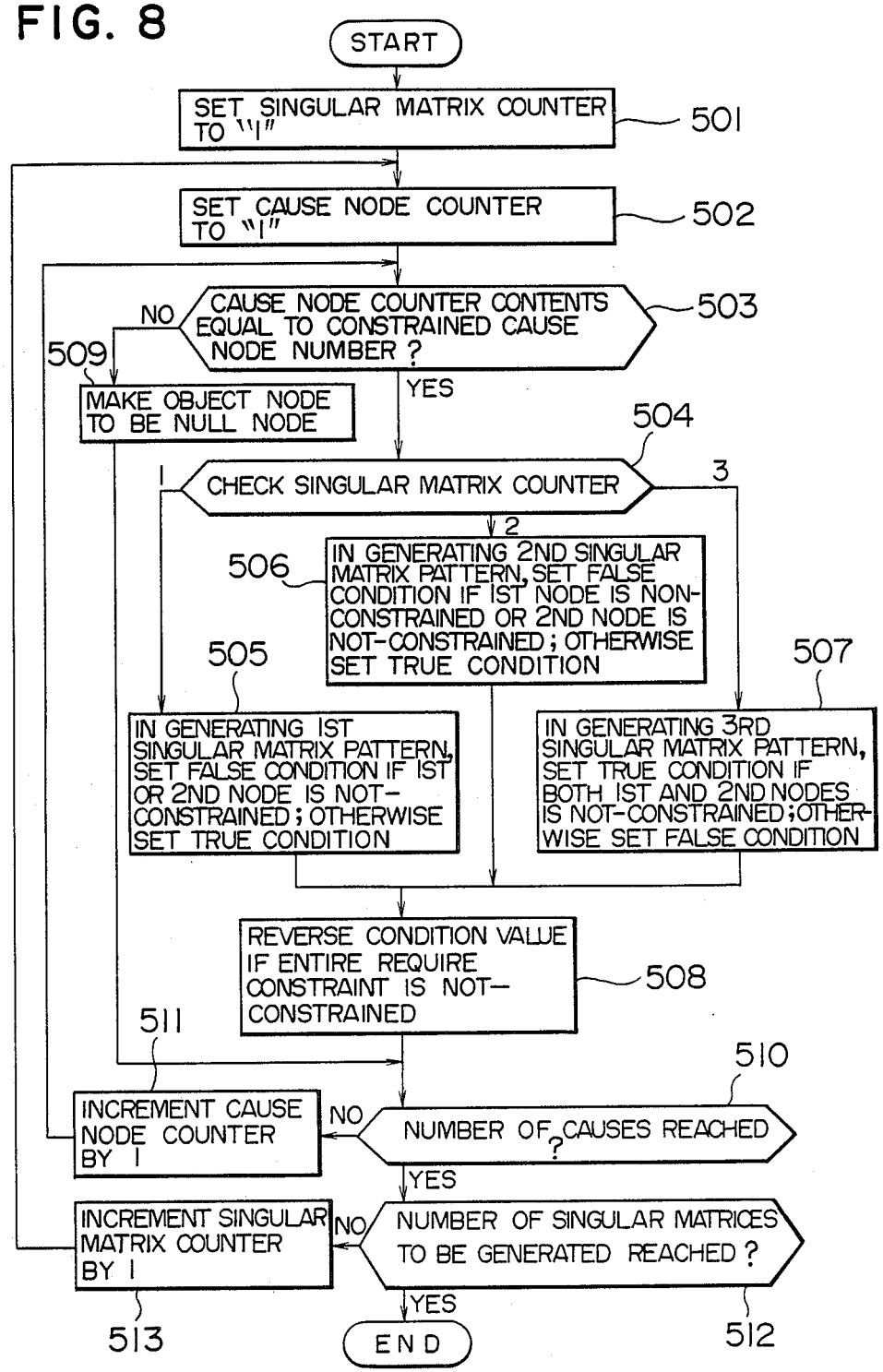

FIG. 8 shows in flowchart the operation of generating singular matrices of Require Constraint. In response to the initiation request based on the constraint type, the section 3 sets the singular matrix counter to "1" (step 501). Next, the section 3 sets the cause node counter to "1" (step 502) and compares it with the constrained cause node number (step 503). If the comparision agrees, the section 3 checks the singular matrix counter and determines the singular matrix patterns to be produced (step 504).

In case of Require constraint, three singular matrix patterns are always produced. When the above counter contains "1", the section 3 sets a false condition to the object node if Not constraint is appended to the first or second node, or otherwise sets a true condition to it, for producing the first singular matrix pattern (step 505). When the above counter contains "2", the section 3 sets a false condition to the object node if no constraint is appended to the first node or Not constraint is appended to the second node, or otherwise sets a true condition to it, for producing the second singular matrix pattern (step 506). When the above counter contains "3", the section 3 sets a true condition to the object node if Not constraint is appended to both the first and second nodes, or otherwise sets a false condition to it, for producing the third singular matrix pattern (step 507). When Not constraint is appended to the entirety of Require constraint, the section 3 reverses the condition values which have been set (step 508).

If the comparison in step 503 agrees, the object node is made to be a null node (step 509). The section 3 increments the cause node counter by one until it reaches the number of causes (steps 510-511), and the above process (steps 503-510) is repeated to produce a singular matrix. When the number of causes has been reached, the section 3 checks whether or not the number of singular matrices to be produced is reached (step 512), increments the singular matrix counter by one until step 512 is fulfilled (step 513), and the singular matrix generation process (steps 502-512) is repeated.

Figure 9:
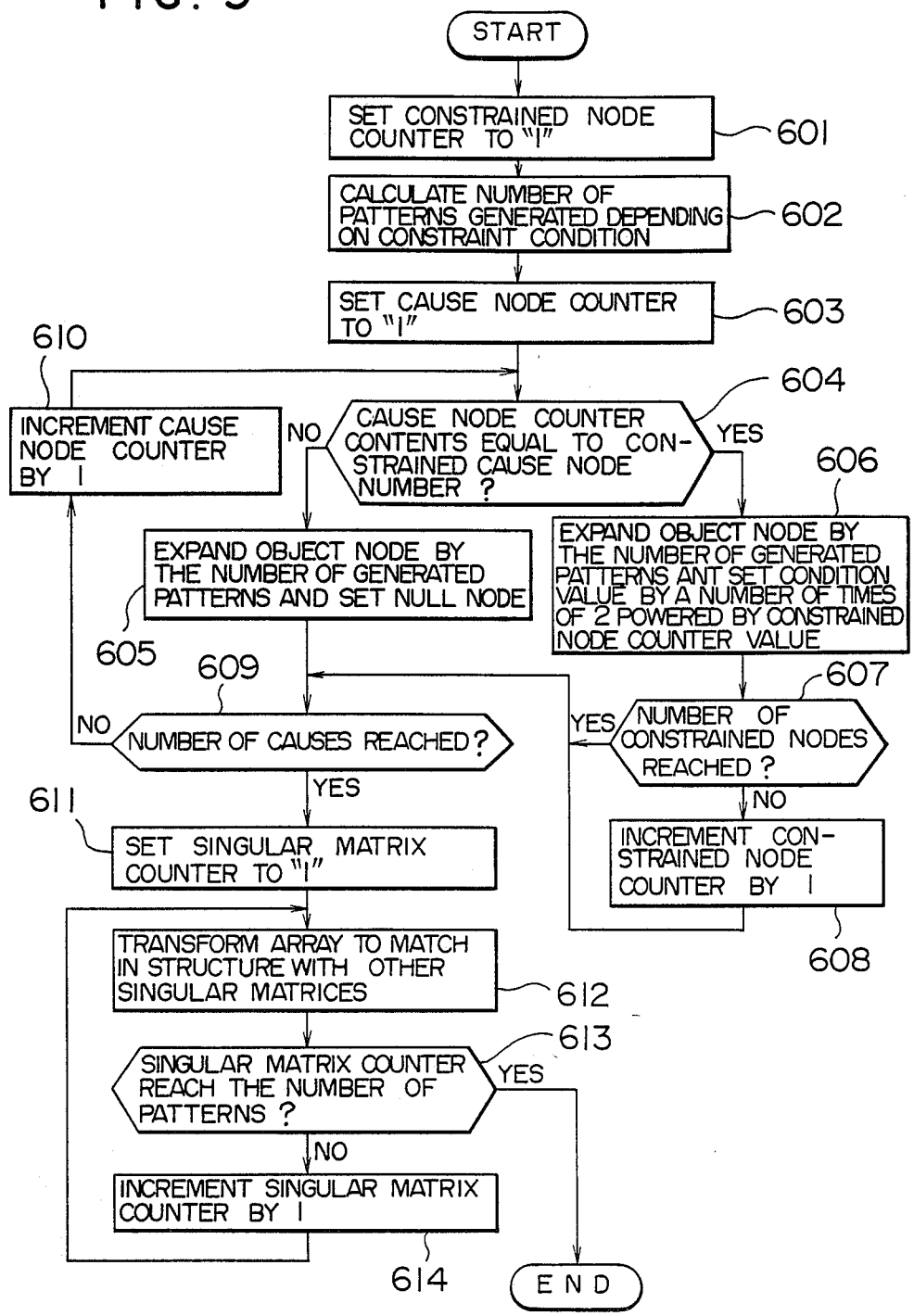

FIG. 9 shows in flowchart the operation of generating singular matrices of inclusive constraint. In response to the initiation request based on the constraint type, the section 3 sets the constrained node counter to "1" (step 601). Next, the section 3 calculates the number of patterns generated depending on the constraint condition (step 602), and sets the cause node counter to "1" (step 603). The section 3 compares the counter contents with the constrained cause node number (step 604), and if the comparison agrees, the section 3 expands the object node into the number of generated patterns and sets the condition value repeatedly for a number of times of 2 powered by the constrained node counter value (step 606).

The section 3 checks whether or not the number of constrained nodes is reached (step 607) and, if it is not yet reached, increments the constrained node counter by one (step 608). If, on the other hand, the comparison of step 604 disagrees, the section 3 expands the object node into the number of generated patterns, and sets null nodes (step 605). The section 3 checks the fulfillment of the number of causes (step 609). The section 3 checks the fulfillment of the number of causes (step 609), and if it is negative the section 3 increments the cause node counter by one until it reaches the number of causes (step 610) and repeats the steps 604-609 to produce a singular matrix. When the number of causes is reached, the section 3 sets the singular matrix counter to "1", implements array transformation for the matching in structure with other singular matrices, thereby rearranging the singular matrix to produce singular matrices of Inclusive constraint (steps 611-614).

The constraint condition check section 4 is to eliminate infeasible combinations between cause nodes by comparing individual intermediate row patterns extracted from the definition table with all singular matrix patterns.

Figure 10B:
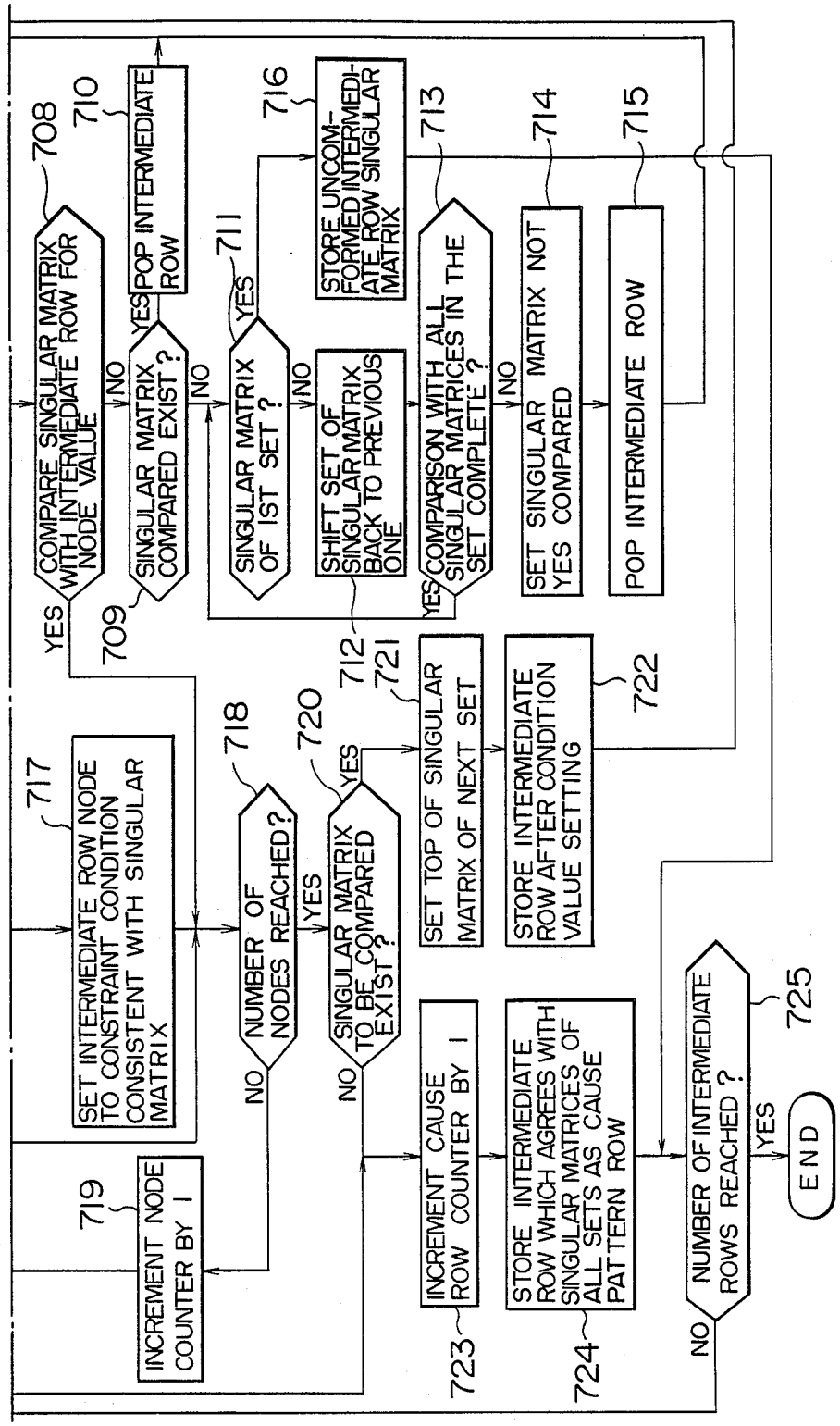

FIG. 10 shows in flowchart the operation of the constraint condition check section 4. Upon receiving the end signal 14 from the singular matrix generation section 3, the constraint condition check section 4 takes in a singular matrix 15 which has been produced by the section 3. The section 4 sets the cause row counter to "0" and sets the intermediate address of the definition table (step 701). Next, the section 4 extracts an intermediate row from the definition table (step 702).

The section 4 checks the presence or absence of a singular matrix to be checked (step 703). If it is present, the section 4 stores the extracted intermediate row (step 704), sets the node counter to "1" (step 705), and examines whether the object node of the singular matrix has a condition value of null (step 706). If the value is not null, the section 4 examines whether the object node of the intermediate row has a condition value of null (step 707). If the value is not null, the section 4 compares the singular matrix with the intermediate row for the object node value (step 708).

If the comparison disagrees, the section 4 checks whether there is any singular matrix to be compared (step 709), and if it is present the section 4 pops the intermediate row which has been saved in step 704 (step 710) and implements the test again as to whether the object node of the singular matrix has a condition value of null (step 706). If there is no singular matrix to be compared, the section 4 examines whether the current set of singular matrix is the first set, and if it is found to be the first set the section 4 stores the disagreed intermediate row and singular matrix (step 716) and transfers control to the execution judgement process for the intermediate row (step 725). If, on the other hand, it is not the first set, the section 4 shifts back the set of singular matrix to the previous one (step 712) and checks whether comparison has been done with all singular matrices of that set (step 713).

If it is found that the comparison has completed, the section 4 transfers control to the judgement (step 711) of as to whether the singular matrix is of the first set. If the comparison is still incomplete, the section 4 sets a singular matrix which has not yet been compared (step 714), pops the saved intermediate row (step 715), and reexecutes the process from the judgement (step 706) of whether the object node of singular matrix has a condition value of null.

If the object node of singular matrix has a condition value of null or if the singular matrix and intermediate row have an equal object node value (step 706 or 708), the section 4 transfers control to the execution judgement process (step 718) for the number of nodes. If the intermediate row has a node value of null (step 707), the section 4 sets the same condition value as of the singular matrix to the object node of intermediate row (step 717). The section 4 increments the node counter by one (step 719) until it reaches the number of nodes (step 718), while executing the above process (steps 706–718) repeatedly.

When the number of nodes is reached, the section 4 checks the presence or absence of a singular matrix to be compared (step 720), and if it is present the section 4 sets the top of the next singular matrix (step 721), stores the intermediate row after setting of condition value (step 722), and transfers control to the node counter initialization (step 705). If in step 720 there is no singular matrix to be compared or if there is no singular matrix to be checked from the beginning (step 703), the section 4 increments the cause row counter by one (step 723) and stores the intermediate row which has agreed with singular matrices of all sets, as a cause pattern row (step 724).

The above process (steps 702-724) is repeated, while checking the reach of the number of intermediate rows (step 725) and incrementing the intermediate row address by one (step 726), so that patterns having infeasible combinations between cause nodes are removed. Upon completion of the process, the section 4 transmits an end signal 17 to the decision table expansion section 5.

The decision table expansion section 5 is to expand patterns of each cause produced by the constraint condition check section 4 for producing all combinational patterns of each cause, and produce effect, state and intermediate pattern rows expansion basing on the combinational patterns.

Figure 11:
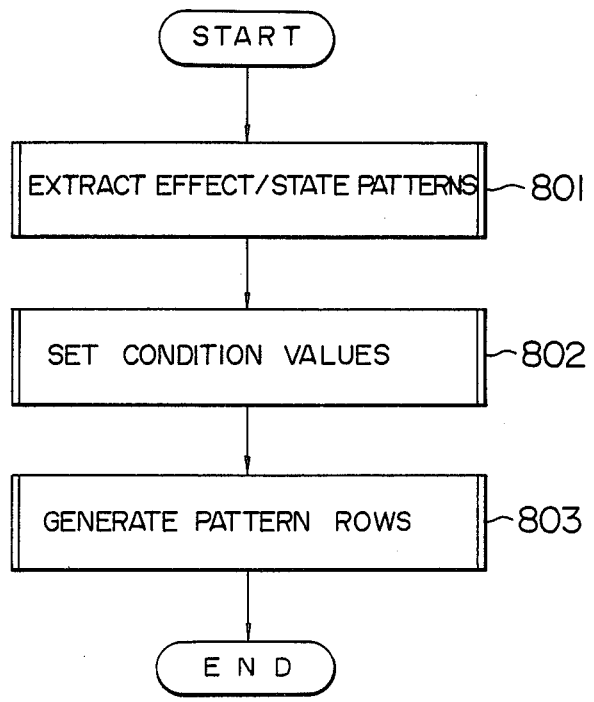
FIG. 11 is a flowchart showing the operation of the decision table expansion section.

FIG. 11 shows in flowchart the operation of the decision table expansion section 5, upon receiving the end signal 17 from the constraint condition check section 4, the decision table expansion section 5 takes in cause pattern rows 19 produced by the section 4, and produces cause, effect, state and intermediate pattern rows through the execution of effect and state pattern row extraction (step 801), condition value setting (step 802), and pattern row generation (step 803). The following describes in detail the operation of each process.

Figure 12:
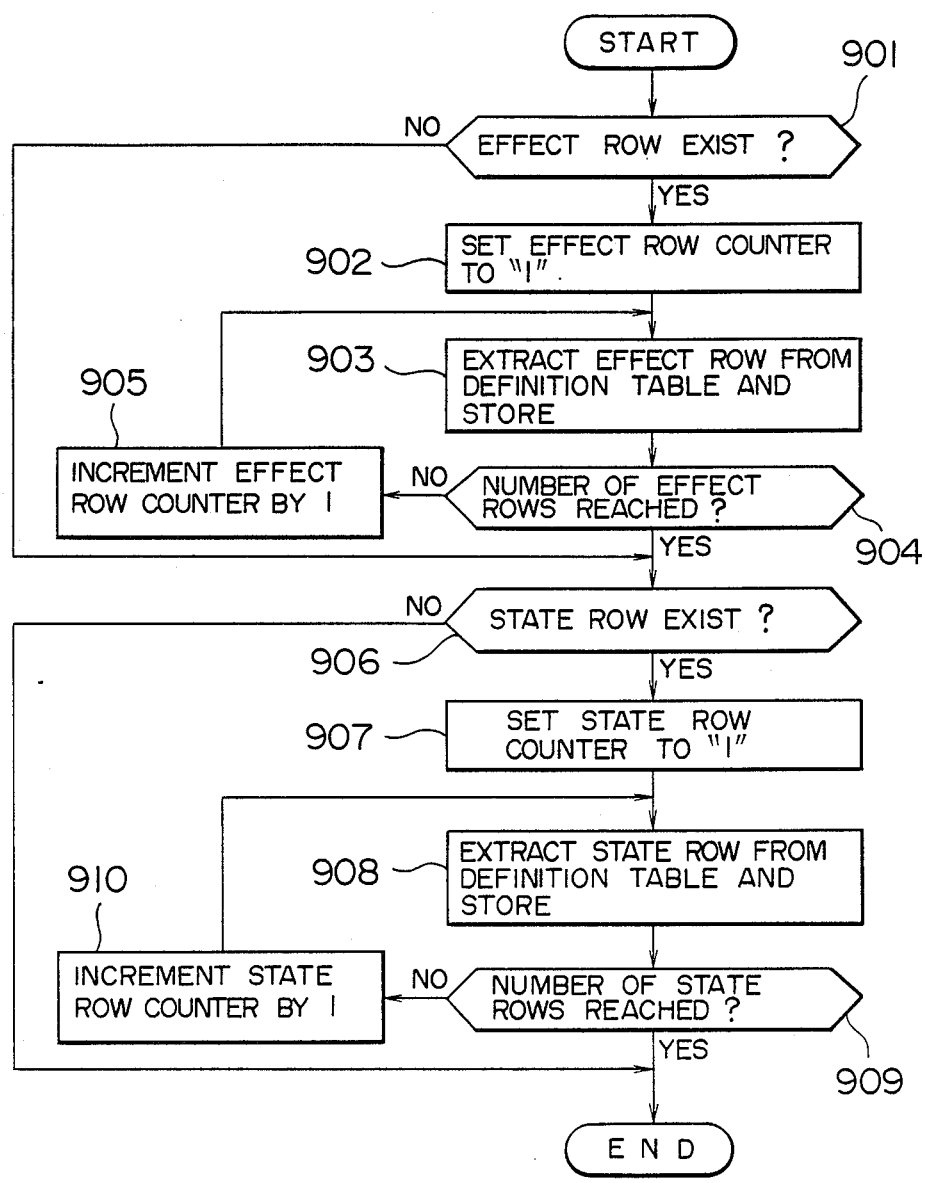
FIGS. 12, 13 and 14 are flowcharts of the subroutines included in FIG. 11.

FIG. 12 shows in flowchart the operation of the effect and state pattern row extraction process. Initially, the section 5 executes the extraction process for effect rows. The section 5 checks whether effect rows exist in the definition table (step 901). If they exist, the section 5 extracts effect rows 18 from the definition table, while incrementing the effect row counter by one until the number of effect rows is reached, and stores the extracted rows (steps 902-905). If no effect row exists in the definition table, the section 5 does nothing, but implements the state row extraction process. State row extraction takes place in the process similar to that of effect row extraction (steps 906-910)

Figure 13:
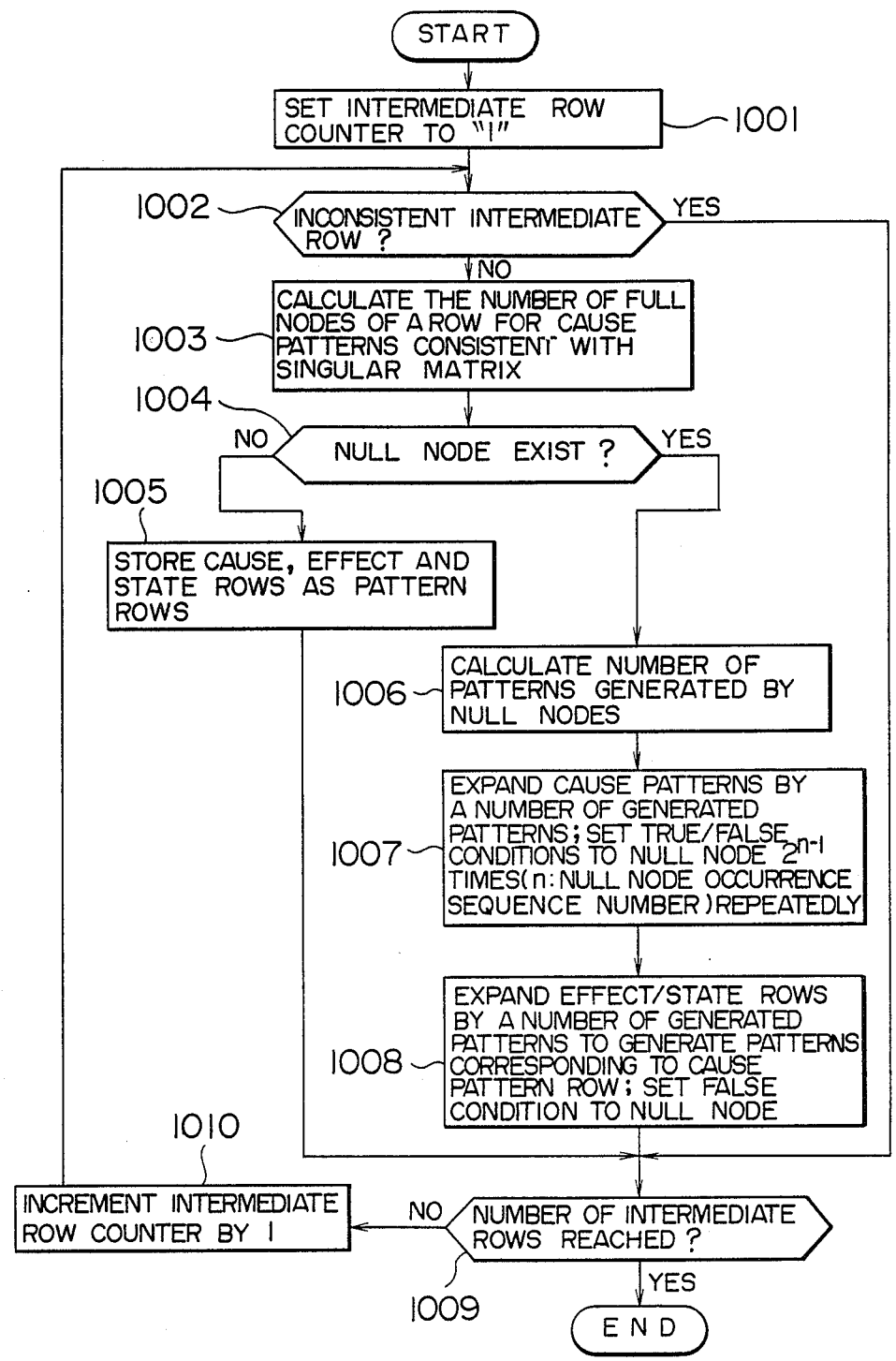

FIG. 13 shows in flowchart the operation of expanding each pattern depending o the number of null nodes and setting condition values in producing patterns. Initially, the section 5 sets the intermediate row counter to "1"(step 1001) and checks whether it is equal to the unconformed intermediate row number (step 1002). If they are equal, the section 5 does nothing and transfers control to the execution judgement process (step 1009) for the number of intermediate rows. If, on the other hand, they are not equal, the section 5 calculates the number of null nodes for cause patterns consistent with the singular matrices (step 1003).

Subsequently, the section 5 checks the presence or absence of null node (step 1004) and, if any null node exists, calculates the number of patterns produced from the null node (step 1006). The section 5 expands the cause pattern by the number of patterns generated, and sets a condition value of true or false $2^{n-1}$ times (where n is the sequence number of null node occurrence) for the null nodes (step 1007). Similarly, the section 5 expands the effect and state rows in correspondence to the cause pattern rows by the number of patterns generated. At this time the section 5 sets a condition value of false for null nodes (step 1008). If no null node exists, the section 5 stores the current cause, effect and state patterns (step 1005). The section 5 implements the above process (steps 1002–1008) repeatedly, while checking the number of intermediate rows (step 1009) and incrementing the intermediate row counter by one (step 1010) until the number of intermediate rows is reached, thereby producing cause, effect and state patterns.

Figure 14:
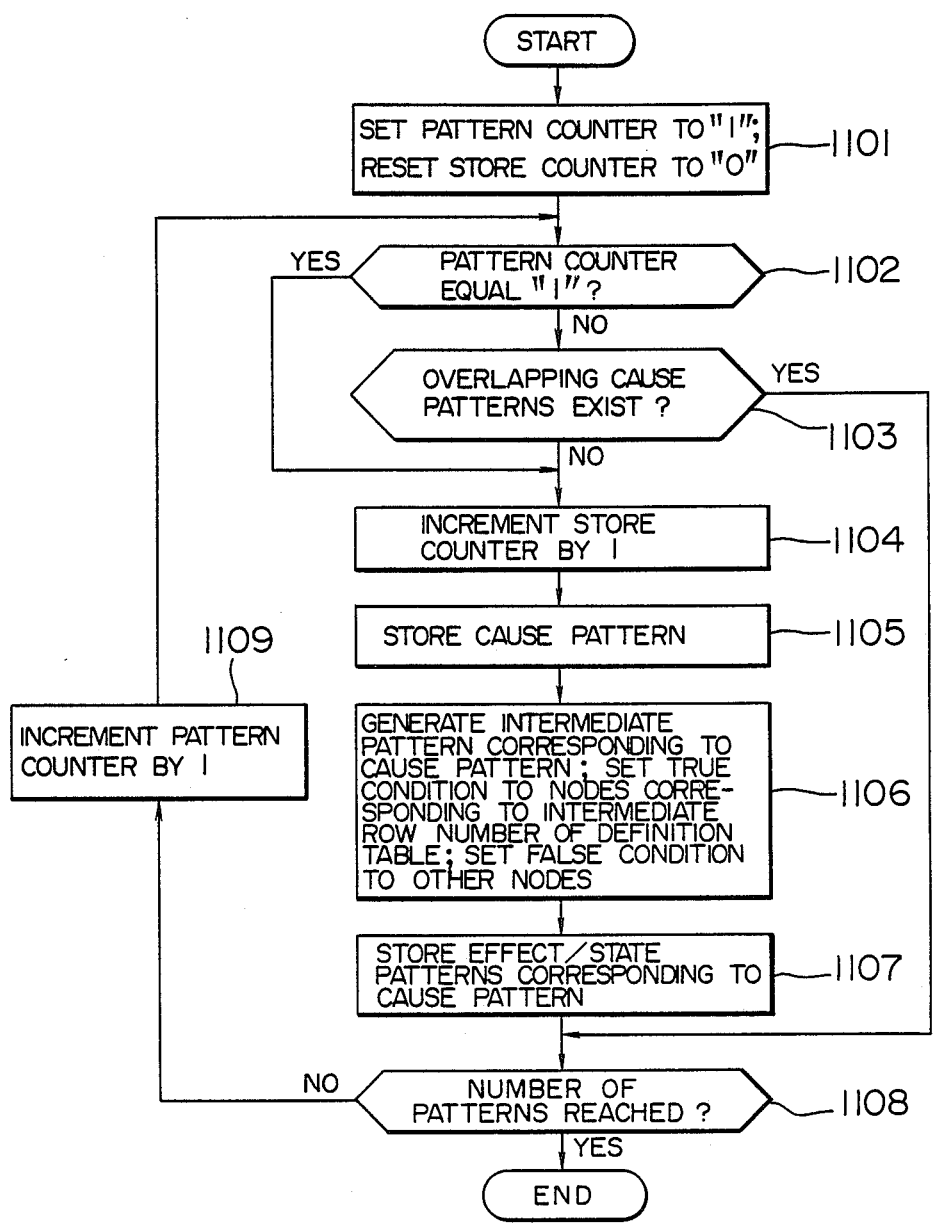

FIG. 14 shows in flowchart the operation of checking the overlap of cause pattern rows and producing intermediate, effect and state pattern rows corresponding to cause pattern rows after removal of overlapping patterns. Initially, the section 5 sets the pattern counter to "1" and resets the store counter to "0" (step 1101). If the pattern counter contains "1", indicating the first cause patatern, the overlap checking is not necessary (step 1102). Otherwise, the section 5 implements the overlap check and removes the same patterns (step 1103). If there is no overlapping pattern, the section 5 increments the store counter by one and stores the cause pattern (steps 1104 and 1105).

Then, the section 5 produces an intermediate pattern corresponding to the cause pattern. At this time the section 5 sets a true condition for nodes corresponding to intermediate row numbers of definition table, and sets a false condition for other nodes (step 1106). The section 5 extracts and stores effect and state patterns corresponding to cause patterns after removal of overlapping patterns (step 1107).

The section 5 implements the above process (steps 1102–1107) until the number of patterns is reached (step 1108), while incrementing the pattern counter by one (step 1109), thereby producing cause, intermediate, effect and state pattern rows. Upon completion of the process, the section 5 transmits an end signal 20 to the partial test-cause generation section 6.

Finally, the partial test-cause generation section 6 is to implement the validity check for the pattern rows generated by the decision table expansion section 5, edit the partial test-patterns and store them.

Figure 15:
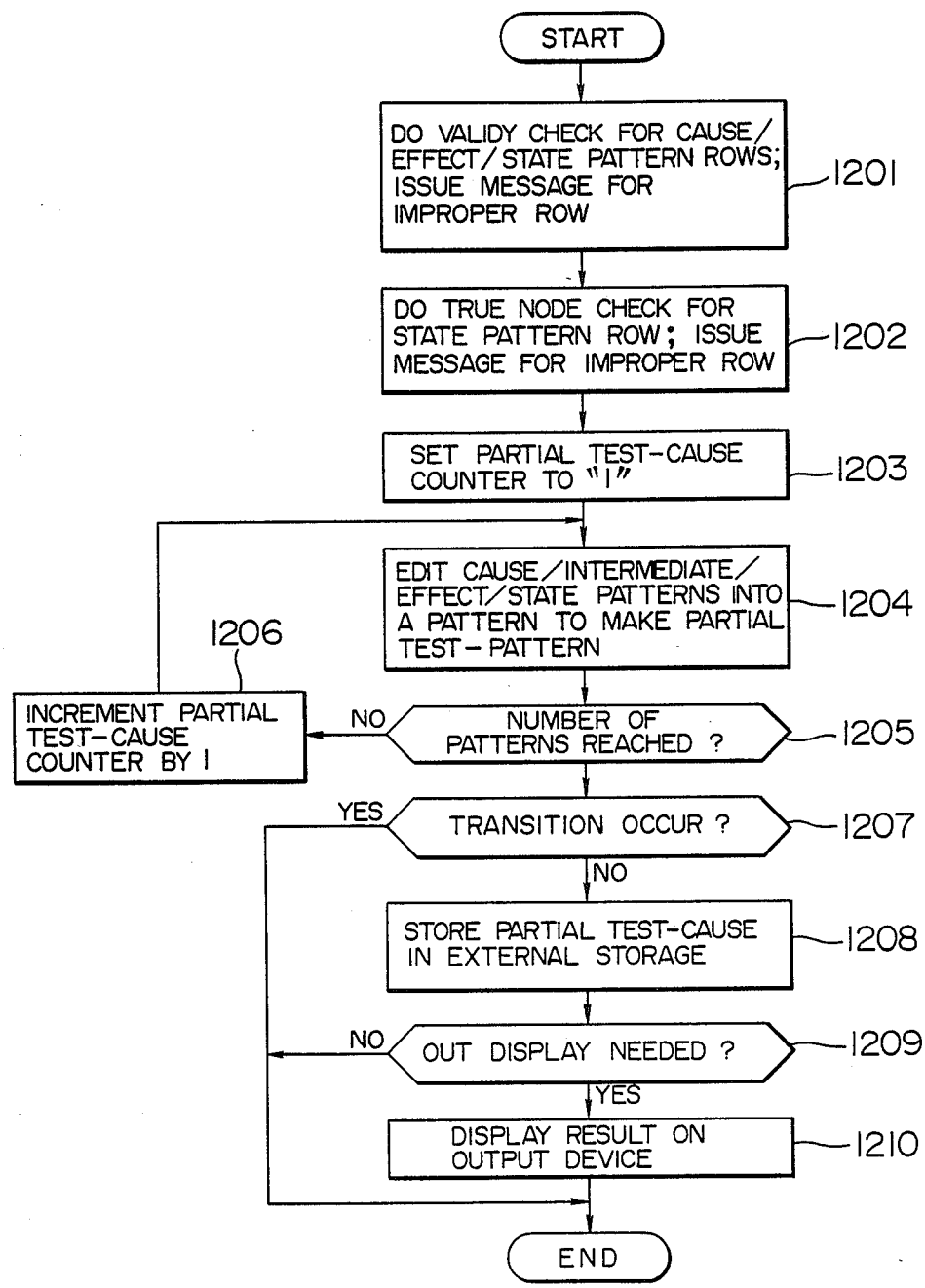
FIG. 15 a flowchart showing the operation of the partial test-cause output device.

FIG. 15 shows in flowchart the operation of the partial test-cause generation section 6. Upon receiving the end signal 20 from the decision table expansion section 5, the partial test-cause generation section 6 takes in the pattern rows 21 produced by the section 5 and implements the validity check for the cause, effect and state pattern rows in units of node row. For an improper row, the section 6 issues an message to the partial test-cause output device (step 1201). The section 6 implements the true node check for state pattern rows, and for an improper row it issues a message to the partial test-cause output device 9 (step 1202). The section 6 sets the partial test-cause counter to "1" (step 1203), edits the cause, intermediate, effect and state patterns into a pattern as a partial test-cause (step 1204).

The section 6 repeats this process, while incrementing the partial test-cause counter by one until the number of patterns is reached (steps 1205–1206). When the number of patterns is reached, the section 6 checks whether there is a next transition (step 1207) and, if there is, it stores the generated partial test-cause, issues a transition signal 22, and transfers control to the input data handling section 2. If there is no transition, the section 6 stores the generated partial test-cause in the partial test-cause storage 8 which is an external storage (step 1208). When display for the output is instructed, the section 6 sends the partial test-cause to the partial test-cause output device 9 for display (steps 1209–1210). Finally, the section 6 issues an end signal 25 and terminates the process of the partial test-cause generation system.

Figure 28:
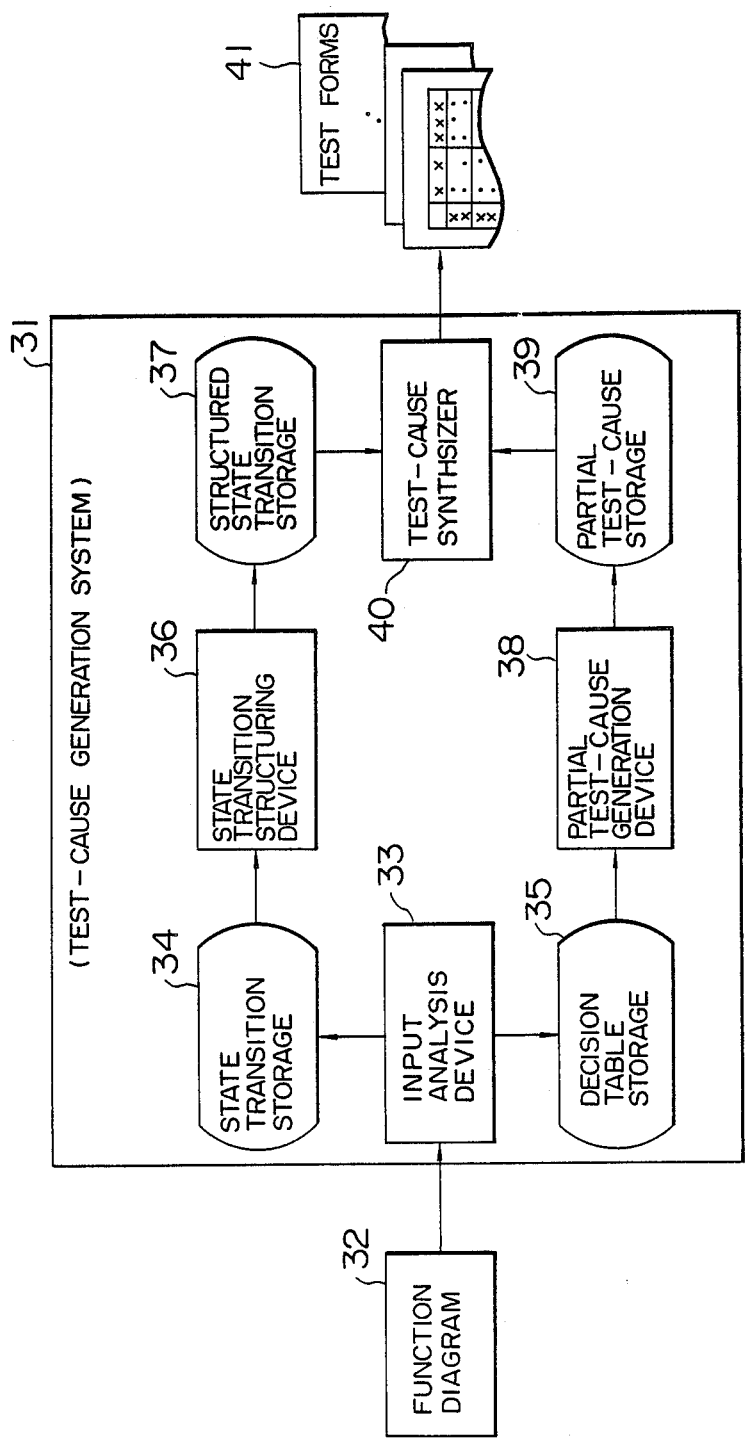
FIG. 28 is a diagram showing the arrangement of the test-cause generation system using the inventive partial test-cause generation device.

FIG. 28 shows, as an example, the arrangement of the test-cause generation system in which the foregoing partial test-cause generation device is used. In this example, the input of the test-cause generation system 31 is expressed as a function diagram 32. The function diagram 32 expresses the sequential relation between input and output of functions of an equipment under test in terms of states and transitions, and it is a means of expression which expresses the input-output correspondence in each state as decision a table. The output is a test-cause, and is expressed in the contents format.

In the test-cause generation system 31, the input which complies with the function diagram is analyzed by an input analysis device 33, the state transition information is stored in a storage 34, and the boolean function expressed in a decision table is stored in a storage 35. A state transition structuring device 36 makes structure basing on the state transition information and stores the structured state transition in a storage 37.

The partial test-cause generation device 38 produces partial test-causes in one state in accordance with the boolean function expressed in the decision table and stores them in a storage 39. A test-cause synthesizer 40 produces testing paths from the structured state transition, produces a test-cause by combining partial test-causes in each state, and displays them as test forms 41.

According to the foregoing embodiment of the invention, the following effectiveness is accomplished when compared with the conventional method which generates partial test-causes from cause-effect graphs.

(1) Since the processing time depends on the number of combinations of decision tables for transitions entered, it can be predicted.

(2) Since partial test-causes are produced directly from decision tables, complex processes related to constraint conditions can be eliminated, and speed-up of process is achieved.

(3) In the case of the decision table, since partial test-causes are produced from all permissible combinations between cause nodes, missing test-causes can be avoided and the test accuracy is improved.

Although the present invention has been described specifically as a partial test-cause generation device and a test-cause generation system, this invention is not confined to the hardware system, but it can of course be practiced prevalently on a software basis with a computer.

As described above, the inventive test-cause generation method for systematically implementing the function test of logical devices is designed to receive boolean functions indicative of the input-output correspondence expressed in decision tables, check the constraint conditions for eliminating infeasible combinations between cause nodes, and expand the decision tables so as to produce all permissible partial test-causes, thereby generating a partial test-cause for checking the relation in each state transition, whereby speed-up of process is accomplished without sacrificing the test accuracy.

I claim:

1. A partial test-cause generation method comprising the following steps:

entering data structure of a boolean function expressed in a decision table, the decision table being indicative of output conditions and states after transition, for combinations of various input conditions;

generating a singular matrix based on the entered data structure;

checking constraint conditions by comparison of the entered data structure and the generated singular matrix to produce a cause pattern row;

expanding the cause pattern row into effect and state pattern rows;

checking the validity of said cause, effect and state pattern rows and;

editing the resulting pattern rows to produce a partial test-cause.

2. A partial test-cause generation method comprising:

a first step of entering information including a constraint row of a boolean function expressed in a decision table indicative of a correspondence between input and output conditions;

a second step of producing a singular matrix for eliminating infeasible combinations in accordance with the constraint row in the decision table entered in said first step;

a third step of comparing the pattern of an intermediate row extracted from said decision table with a pattern of the singular matrix produced in said second step, checking constraint conditions for eliminating infeasible combinations between cause nodes, and producing a cause pattern row;

a fourth step of expanding the cause pattern row produced in said third step, producing all combinational pattern separately for each cause, and producing effect, state and intermediate pattern rows in accordance with said combinational patterns; and, a fifth step of implementing a validity check for said cause, effect and state pattern rows, and editing said pattern rows to produce a partial test-cause.

3. A partial test-cause generation apparatus comprising:

first means for entering data structure of a boolean function expressed in a decision table, the decision table being indicative of output conditions and the states after transition, for combinations of various input conditions;

second means for generating a singular matrix based on the entered data structure;

third means for checking constraint conditions by comparison of the entered data structure and the generated singular matrix to produce a cause pattern row;

fourth means for expanding the cause pattern row produced by said third means into effect and state pattern rows; and fifth means for checking the validity of said cause, effect and state pattern rows, and editing the resulting pattern rows to produce a partial test-cause.

4. A partial test-cause generation apparatus comprising:

first means for entering data structure of a boolean function in the form of a decision table, the decision table being indicative of output conditions and states after transition, for combinations of various input conditions;

second means for producing a singular matrix for eliminating infeasible combinations in accordance with a constraint row in the decision table entered by said first means;

third means for comparing a pattern of an intermediate row extracted from said decision table with a pattern of singular matrix produced by said second means, checking constraint conditions by comparison for the entered data structure and the generated singular matrix to produce a cause pattern row;

fourth means for expanding the cause pattern produced by said third means, producing all combinational patterns separately for each cause, and producing effect, state and intermediate pattern rows in accordance with said combinational patterns; and fifth means for implementing a validity check for said cause, effect and state pattern rows, and editing said pattern rows to produce a partial test-cause.

* * * * *

UNITED STATES PATENT AND TRADEMARK OFFICE
CERTIFICATE OF CORRECTION

PATENT NO. : 4,885,712

DATED : December 5, 1989

INVENTOR(S) : Yasuaki Yamane

It is certified that error appears in the above-identified patent and that said Letters Patent is hereby corrected as shown below:

Claim 2, column 15, line 27, "pattern" should be --patterns--.

Signed and Sealed this

Sixteenth Day of April, 1991

Attest:

HARRY F. MANBECK, JR.

*Attesting Officer*          *Commissioner of Patents and Trademarks*